(12) United States Patent
Michikoshi

(10) Patent No.: US 11,881,524 B2
(45) Date of Patent: Jan. 23, 2024

(54) SEMICONDUCTOR DEVICE

(71) Applicant: SUMITOMO ELECTRIC INDUSTRIES, LTD., Osaka (JP)

(72) Inventor: Hisato Michikoshi, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 218 days.

(21) Appl. No.: 17/310,960

(22) PCT Filed: Mar. 5, 2020

(86) PCT No.: PCT/JP2020/009454
§ 371 (c)(1),
(2) Date: Sep. 2, 2021

(87) PCT Pub. No.: WO2020/184383
PCT Pub. Date: Sep. 17, 2020

(65) Prior Publication Data
US 2022/0052189 A1 Feb. 17, 2022

(30) Foreign Application Priority Data
Mar. 12, 2019 (JP) ................. 2019-045172

(51) Int. Cl.
H01L 29/739 (2006.01)
H01L 23/367 (2006.01)
(Continued)

(52) U.S. Cl.
CPC ...... *H01L 29/7395* (2013.01); *H01L 23/3672* (2013.01); *H01L 23/40* (2013.01); *H01L 25/072* (2013.01)

(58) Field of Classification Search
None
See application file for complete search history.

(56) References Cited

U.S. PATENT DOCUMENTS

| 2009/0042337 A1* | 2/2009 | Landau | H01L 24/83 438/109 |
| 2012/0228757 A1* | 9/2012 | Kitami | H01L 23/36 257/713 |
| 2017/0148770 A1* | 5/2017 | Ishino | H01L 23/3121 |

FOREIGN PATENT DOCUMENTS

| JP | 2002-208673 | 7/2002 |
| JP | 2004-193476 | 7/2004 |

(Continued)

*Primary Examiner* — Nishath Yasmeen
(74) *Attorney, Agent, or Firm* — IPUSA, PLLC

(57) ABSTRACT

A semiconductor device includes: a first semiconductor chip having first and second electrodes on a first surface and having a third electrode on a second surface; a second semiconductor chip having first and second electrodes on a first surface and having a third electrode on a second surface; a first electrode plate bonded to the second electrode of the first semiconductor chip; a second electrode plate bonded to the third electrode of the second semiconductor chip; and a third electrode plate having a first area sandwiched between the first and second semiconductor chips and a second area not sandwiched between the first and second semiconductor chips, one surface of the first area is bonded to the second electrode of the second semiconductor chip, and another surface is bonded to the third electrode of the first semiconductor chip, and the first area is thinner than the second area.

11 Claims, 21 Drawing Sheets

(51) Int. Cl.
*H01L 23/40* (2006.01)
*H01L 25/07* (2006.01)

(56) References Cited

FOREIGN PATENT DOCUMENTS

| | | | |
|---|---|---|---|
| JP | 2004193476 A | * | 7/2004 |
| JP | 2008-042074 | | 2/2008 |
| JP | 2013-236035 | | 11/2013 |
| JP | 2014-130894 | | 7/2014 |

* cited by examiner

SEMICONDUCTOR DEVICE

TECHNICAL FIELD

The present disclosure relates to a semiconductor device.

The present application is based on and claims priority to Japanese Patent Application No. 2019-045172, filed on Mar. 12, 2019, the entire contents of the Japanese Patent Application are hereby incorporated herein by reference.

BACKGROUND ART

Silicon carbide semiconductor devices, such as metal-oxide-semiconductor field-effect transistors (MOSFETs), are usually hardened with mold resin or the like, in a state in which a semiconductor chip is connected to an electrode terminal. As materials used for semiconductor chips, silicon is common, but in order to enhance withstand voltage, there is a vertical transistor that uses silicon carbide (SiC), which has a wider band gap than silicon (Si), and that has a structure in which a current flows in the thickness direction. Also, a semiconductor device to be a semiconductor module including a plurality of such vertical transistors is disclosed.

PRIOR ART DOCUMENTS

Patent Documents

[Patent Document 1] Japanese Laid-open Patent Publication No. 2014-130894

SUMMARY OF THE INVENTION

According to the present disclosure, a semiconductor device includes: a first semiconductor chip having a first electrode and a second electrode on a first surface and having a third electrode on a second surface that is opposite to the first surface; a second semiconductor chip having a first electrode and a second electrode on a first surface and having a third electrode on a second surface that is opposite to the first surface; a first electrode plate bonded to the second electrode of the first semiconductor chip by a bonding material; and a second electrode plate bonded to the third electrode of the second semiconductor chip by a bonding material. The semiconductor device further includes a third electrode plate placed between the first semiconductor chip and the second semiconductor chip and having a first area sandwiched between the first semiconductor chip and the second semiconductor chip and a second area not sandwiched between the first semiconductor chip and the second semiconductor chip, wherein one surface of the first area of the third electrode plate is bonded to the second electrode of the second semiconductor chip by a bonding material, and another surface of the first area of the third electrode plate is bonded to the third electrode of the first semiconductor chip by a bonding material, and wherein in the third electrode plate, the first area is thinner than the second area.

EMBODIMENT FOR CARRYING OUT THE INVENTION

Figure 1:
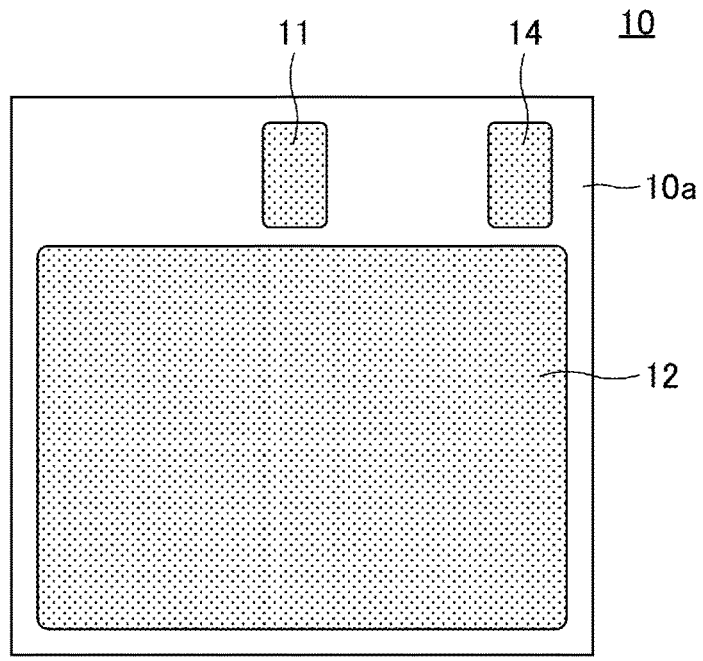
FIG. 1 is a plan view of a first surface of a first semiconductor chip.
Figure 2:
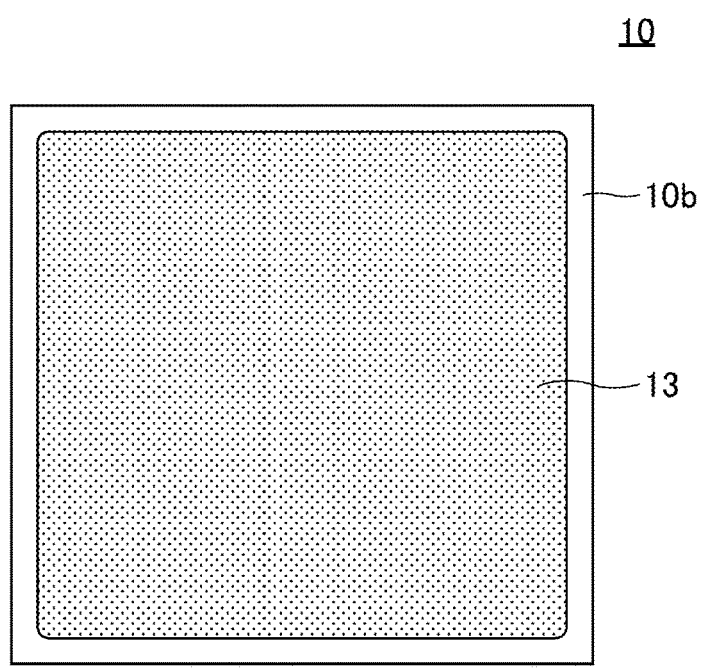
FIG. 2 is a plan view of a second surface of the first semiconductor chip.

Problem to be Solved by the Present Disclosure

A conventional semiconductor device including a plurality of vertical transistors using SiC has a high withstand voltage and enables to flow a large current. However, when a large current flows in a semiconductor chip, heat is generated, and thus efficient heat dissipation is required.

Therefore, for a semiconductor device including a plurality of vertical transistors, a semiconductor device that can efficiently dissipate heat is desired.

Effect of the Present Disclosure

According to the present disclosure, heat can be efficiently dissipated in a semiconductor device including a plurality of vertical transistors.

The embodiments will be described below.

DESCRIPTION OF EMBODIMENTS OF THE PRESENT DISCLOSURE

First, aspects of the present disclosure are listed and described below. In the following description, the same reference numerals are assigned to the same or corresponding elements and the same descriptions thereof are not repeated.

[1] According to one aspect of the present disclosure, a semiconductor device includes: a first semiconductor chip having a first electrode and a second electrode on a first surface and having a third electrode on a second surface that is opposite to the first surface; a second semiconductor chip having a first electrode and a second electrode on a first surface and having a third electrode on a second surface that is opposite to the first surface; a first electrode plate bonded to the second electrode of the first semiconductor chip by a bonding material; a second electrode plate bonded to the third electrode of the second semiconductor chip by a bonding material; and a third electrode plate placed between the first semiconductor chip and the second semiconductor chip and having a first area sandwiched between the first semiconductor chip and the second semiconductor chip and a second area not sandwiched between the first semiconductor chip and the second semiconductor chip, wherein one surface of the first area of the third electrode plate is bonded to the second electrode of the second semiconductor chip by a bonding material, and another surface of the first area of the third electrode plate is bonded to the third electrode of the first semiconductor chip by a bonding material, and wherein in the third electrode plate, the first area is thinner than the second area.

Accordingly, heat generated in the first semiconductor chip is conducted to the first electrode, heat generated in the second semiconductor chip is conducted to the first electrode through the first area at which the thickness is thin and the first semiconductor chip, and the heat is dissipated at the first electrode. Therefore, the heat generated in the first semiconductor chip and the second semiconductor chip can be efficiently dissipated.

[2] A thickness of the first area of the third electrode plate may be greater than or equal to 0.1 mm and may be less than or equal to a thickness of the first semiconductor chip and the second semiconductor chip. In this case, while making it easier to flow a current output from the third electrode of the first semiconductor chip and the second electrode of the second semiconductor chip toward the second area, effects of the difference in the linear expansion coefficient with the first semiconductor chip and the second semiconductor chip can be suppressed. Further, heat generated in the second semiconductor chip can be more efficiently dissipated to the semiconductor chip of the first chip.

[3] The semiconductor device may further include: a first insulating film provided on part of one surface of the first electrode plate; a first conductive layer provided on the first insulating film; a second insulating film provided on part of one surface of the third electrode plate; and a second conductive layer provided on the second insulating film, wherein the first electrode of the first semiconductor chip and the first conductive layer may be bonded by a bonding material, and wherein the first electrode of the second semiconductor chip and the second conductive layer may be bonded by a bonding material. In this case, a signal can be applied from the first conductive layer to the first electrode of the first semiconductor chip and a signal can be applied from the second conductive layer to the first electrode of the second semiconductor chip.

[4] A heat sink may be connected to another surface of the first electrode plate. In this case, heat is easily dissipated.

[5] The first electrode plate, the second electrode plate, and the third electrode plate may have a thermal conductivity of 10 W/m·K or more, a linear expansion coefficient of 17.0 ppm/K or less, and a volume resistivity of 1 $\mu\Omega$·m or less. In this case, the thermal resistance is easily reduced and peeling does not easily occur.

[6] The bonding materials may include copper or silver. In this case, the thermal resistance can be further easily reduced.

[7] A thickness of the third electrode plate gradually may increase from the first area toward the second area. In this case, the thickness can be gradually changed between the first area and the second area. In this case, the thickness is gradually changed between the first area and the second area.

[8] The first electrodes may be gate electrodes, the second electrodes may be source electrodes, and the third electrodes may be drain electrodes. In this case, for example, a field effect transistor can be constituted.

[9] The first electrodes may be gate electrodes, the second electrodes may be emitter electrodes, and the third electrodes may be collector electrodes. In this case, for example, an insulated gate bipolar transistor (IGBT) can be constituted.

[10] The first semiconductor chip and the second semiconductor chip may include a vertical transistor. In this case, while obtaining a high withstand voltage, it is easy to cause a large current to flow.

[11] The first semiconductor chip and the second semiconductor chip may be silicon carbide semiconductor chips. In this case, it is easy to obtain an excellent withstand voltage and it is easy to cause a large current to flow.

[12] According to another one aspect of the present disclosure, a semiconductor device includes: a first semiconductor chip having a first electrode and a second electrode on a first surface and having a third electrode on a second surface that is opposite to the first surface; a second semiconductor chip having a first electrode and a second electrode on a first surface and having a third electrode on a second surface that is opposite to the first surface; a first electrode plate bonded to the second electrode of the first semiconductor chip by a bonding material; a second electrode plate bonded to the third electrode of the second semiconductor chip by a bonding material; and a third electrode plate placed between the first semiconductor chip and the second semiconductor chip and having a first area sandwiched between the first semiconductor chip and the second semiconductor chip and a second area not sandwiched between the first semiconductor chip and the second semiconductor chip; a first insulating film provided on part of one surface of the first electrode plate; a first conductive layer provided on the first insulating film; a second insulating film provided on part of one surface of the third electrode plate; a second conductive layer provided on the second insulating film, wherein the first electrode of the first semiconductor chip and the first conductive layer are bonded by a bonding material, wherein the first electrode of the second semiconductor chip and the second conductive layer are bonded by a bonding material, wherein one surface of the first area of the third electrode plate is bonded to the second electrode of the second semiconductor chip by a bonding material, and another surface of the first area of the third electrode plate is bonded to the third electrode of the first semiconductor chip by a bonding material, wherein the bonding materials include copper or silver, wherein a heat sink is connected to another surface of the first electrode plate, and wherein in the third electrode plate, the first area is thinner than the second area.

[13] According to another one aspect of the present disclosure, a semiconductor device includes: a first semiconductor chip having a first electrode and a second electrode on a first surface and having a third electrode on a second surface that is opposite to the first surface; a second semiconductor chip having a first electrode and a second electrode on a first surface and having a third electrode on a second surface that is opposite to the first surface; a first electrode plate bonded to the second electrode of the first semiconductor chip by a bonding material; a second electrode plate bonded to the third electrode of the second semiconductor chip by a bonding material; a third electrode plate placed between the first semiconductor chip and the second semiconductor chip and having a first area sandwiched between the first semiconductor chip and the second semiconductor chip and a second area not sandwiched between the first semiconductor chip and the second semiconductor chip; a first insulating film provided on part of one surface of the first electrode plate; a first conductive layer provided on the first insulating film; a second insulating film provided on part of one surface of the third electrode plate; and a second conductive layer provided on the second insulating film, wherein the first electrode of the first semiconductor chip and the first conductive layer are bonded by a bonding material, wherein the first electrode of the second semiconductor chip and the second conductive layer are bonded by a bonding material, wherein one surface of the first area of the third electrode plate is bonded to the second electrode of the second semiconductor chip by a bonding material, and another surface of the first area of the third electrode plate is bonded to the third electrode of the first semiconductor chip by a bonding material, wherein the bonding materials include copper or silver, wherein a heat sink is connected to another surface of the first electrode plate, wherein in the third electrode plate, the first area is thinner than the second area, and wherein a thickness of the third electrode plate gradually increases from the first area toward the second area.

Details of Embodiments of the Present Disclosure

In the following, an embodiment of the present disclosure (hereinafter referred to as "the present embodiment") will be described in detail, but the present embodiment is not limited to specifics described below. Also, the length, the size, and the like in the drawings may differ from the actual one, for convenience of illustration.

First Embodiment

In a semiconductor device in a first embodiment, a first semiconductor chip and a second semiconductor chip are used. The first semiconductor chip and the second semiconductor chip are of the same structure in which a vertical transistor is formed on a SiC substrate.

Figure 3:
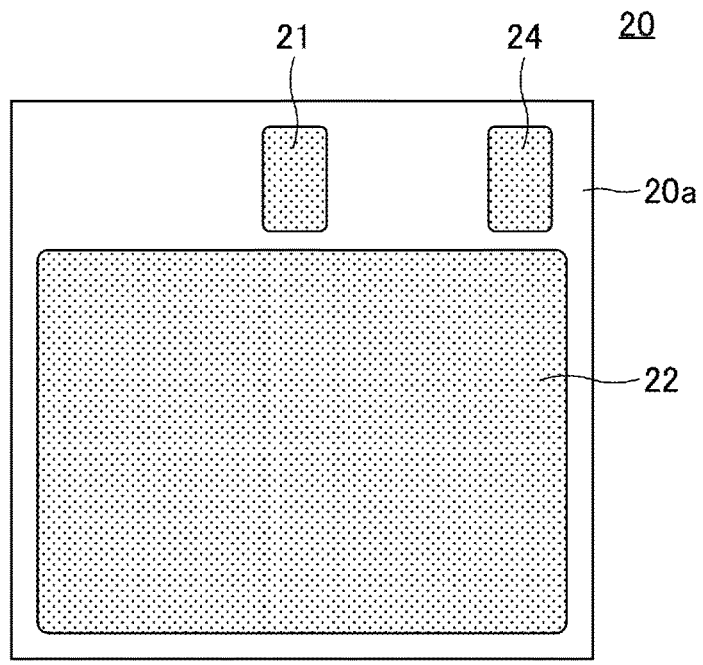
FIG. 3 is a plan view of a first surface of a second semiconductor chip.
Figure 4:
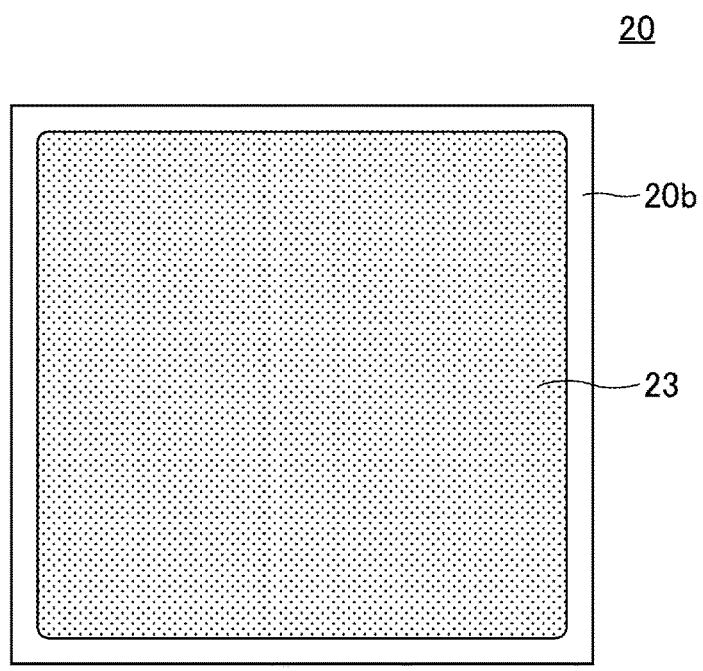
FIG. 4 is a plan view of a second surface of the second semiconductor chip.

Specifically, as illustrated in FIG. 1, a gate electrode 11, a source electrode 12, and a Kelvin source electrode 14 are formed on a first surface 10a of a first semiconductor chip 10, and a drain electrode 13 is formed on a second surface 10b that is opposite to the first surface 10a. Similarly, as illustrated in FIG. 3, a gate electrode 21, a source electrode 22, and a Kelvin source electrode 24 are formed on a first surface 20a of a second semiconductor chip 20, and a drain electrode 23 is formed on a second surface 20b opposite to the first surface 20a. It should be noted that in the present application, the first surface and the second surface are surfaces opposite to each other.

In the present application, the gate electrodes 11 and 21 may be referred to as first electrodes, the source electrodes 12 and 22 may be referred to as second electrodes, and the drain electrodes 13 and 23 may be referred to as third electrodes.

Next, a semiconductor device that is a vertical semiconductor module in which the first semiconductor chip 10 and the second semiconductor chip 20 are used will be described with reference to FIG. 5. It should be noted that in the description of FIG. 5, the Kelvin source electrode 14 of the first semiconductor chip 10 and the Kelvin source electrode 24 of the second semiconductor chip 20 are omitted.

Figure 5:
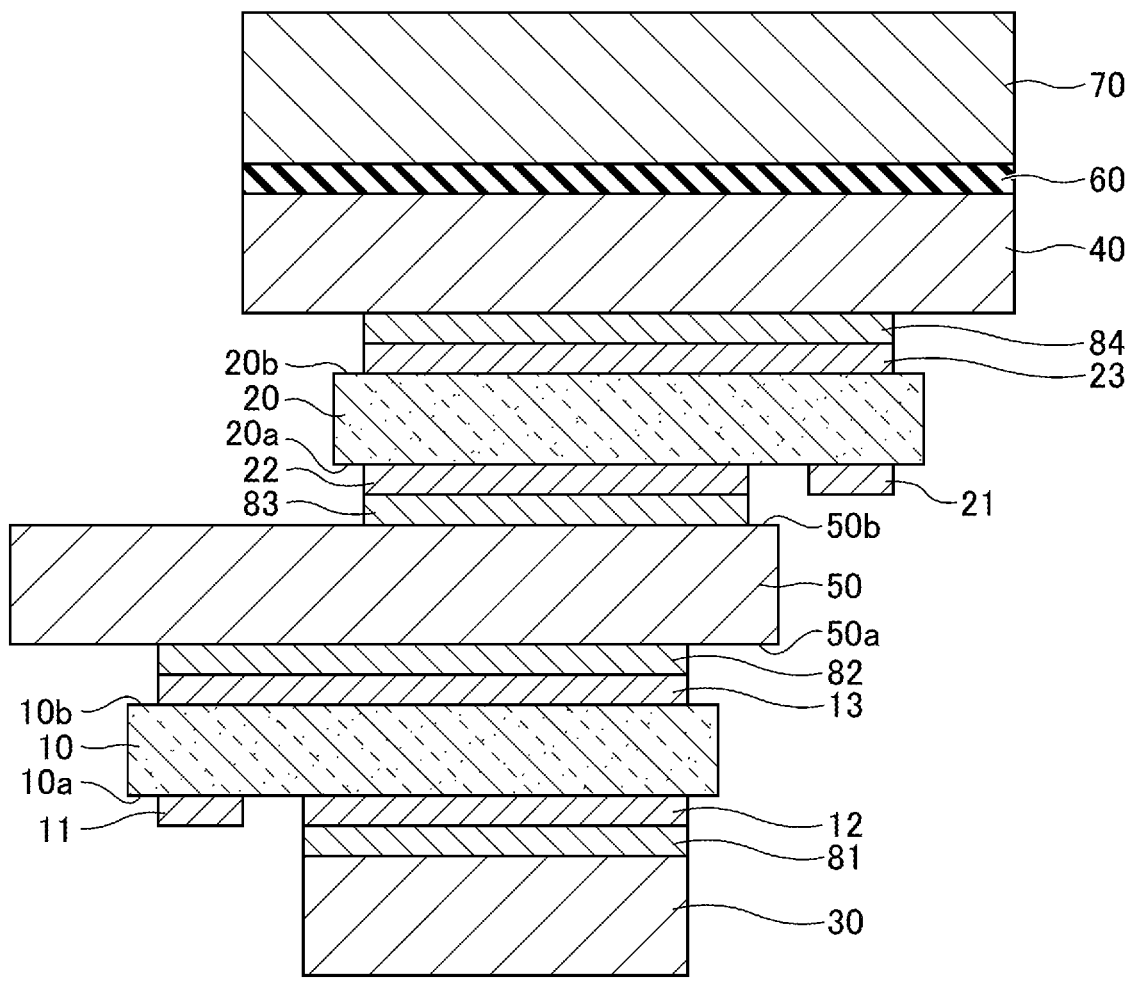
FIG. 5 is a cross-sectional view of a structure of a semiconductor device.

In the semiconductor device illustrated in FIG. 5, the source electrode 12 on the first surface 10a of the first semiconductor chip 10 and an N-electrode plate 30 are bonded by a bonding material 81. Also, the drain electrode 23 on the second surface 20b of the second semiconductor chip 20 and a P-electrode plate 40 are bonded by a bonding material 84. An O-electrode plate 50 is provided between the second surface 10b of the first semiconductor chip 10 and the first surface 20a of the second semiconductor chip 20. The drain electrode 13 on the second surface 10b of the first semiconductor chip 10 and one surface 50a of the O-electrode plate 50 are bonded by a bonding material 82 and the source electrode 22 on the first surface 20a of the second semiconductor chip 20 and another surface 50b of the O-electrode plate 50 are bonded by a bonding material 83. It should be noted that in the present application, one surface and said another surface are surfaces opposite to each other.

The N-electrode plate 30 and the P-electrode plate 40 are input terminals and a high voltage is applied to the P-electrode plate 40. The O-electrode plate 50 is an output terminal of driving output of the first semiconductor chip and the second semiconductor chip 20. In such a semiconductor device, upon driving the first semiconductor chip 10 and the second semiconductor chip 20, heat is generated. Therefore, a heat sink 70 is provided for dissipating heat of the first semiconductor chip 10 and the second semiconductor chip 20. In the semiconductor device illustrated in FIG. 5, because a high voltage is applied to the P-electrode plate 40, an insulating sheet 60 is provided between the P-electrode plate 40 and the heat sink 70 for insulation.

It should be noted that the first semiconductor chip 10 and the second semiconductor chip 20 are vertical transistors made of SiC, and the N-electrode plate 30, the P-electrode plate 40, and the O-electrode plate 50 are made of copper or the like. The bonding materials 81, 82, 83, and 84 are made of Sn—Cu solder or the like, and the heat sink 70 is made of Al (aluminum), Cu (copper), or the like. The insulating sheet 60 is made of an insulating organic material, such as polyimide.

Generally, metal has a high thermal conductivity and can easily conduct heat, but the insulating sheet 60 provided between the P-electrode plate 40 and the heat sink 70 is an insulator and thus the thermal conductivity is very low. Therefore, heat generated in the first semiconductor chip 10 or the second semiconductor chip 20 and conducted to the P-electrode plate 40 is hindered by the insulating sheet 60 and cannot be efficiently conducted to the heat sink 70. That is, the heat generated in the first semiconductor chip 10 or the second semiconductor chip 20 is conducted to the P-electrode plate 40, but the thermal resistance between the P-electrode plate 40 and the heat sink 70 is high, and thus thermal conduction is hindered by the insulating sheet 60. Therefore, the temperature of the first semiconductor chip 10 or the second semiconductor chip 20 becomes high.

Semiconductor Device

Figure 6:
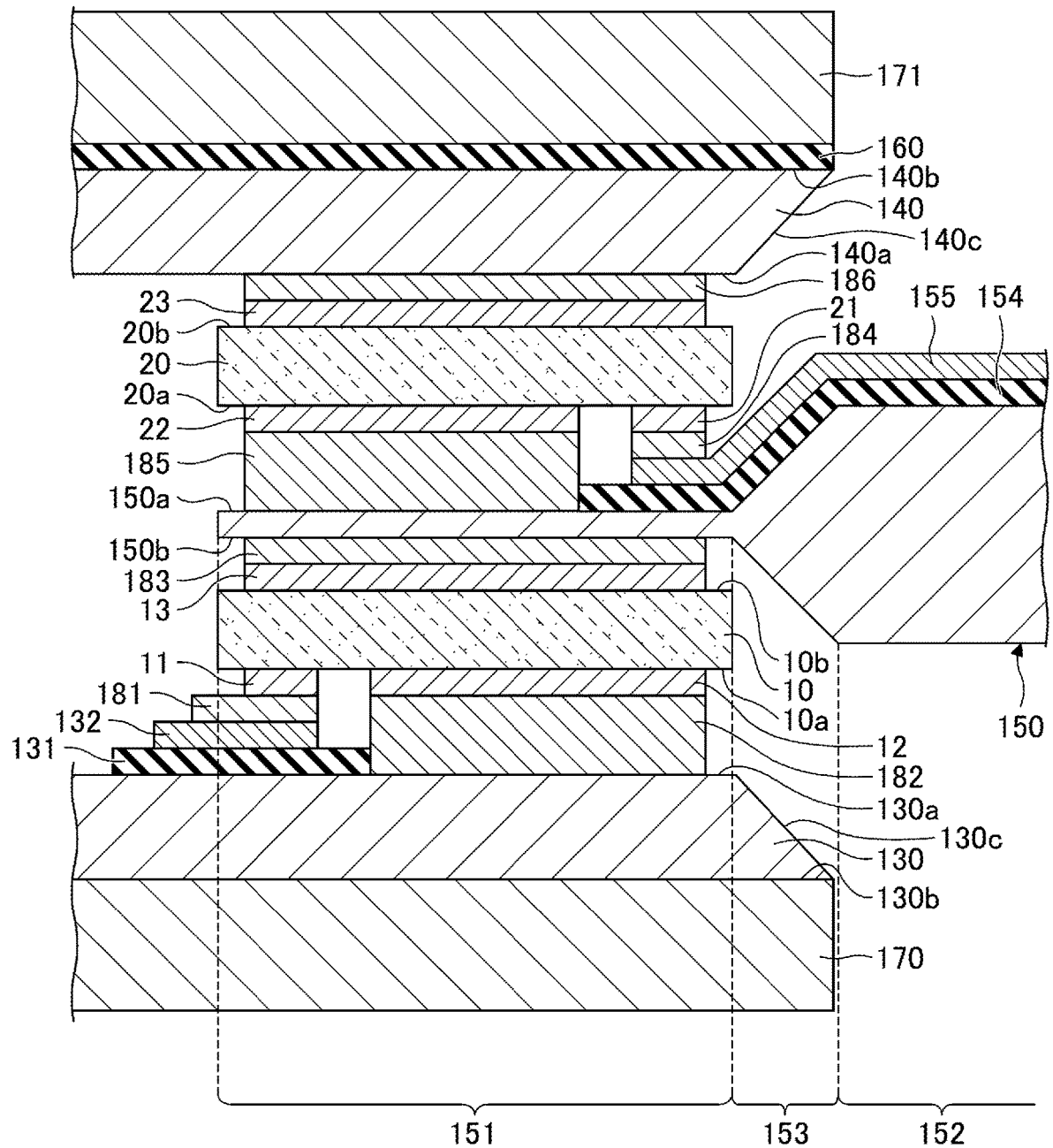
FIG. 6 is a cross-sectional view of a structure of a semiconductor device according to a first embodiment of the present disclosure.

Next, a semiconductor device according to the first embodiment will be described with reference to FIG. 6. The semiconductor device illustrated in FIG. 6 is a vertical semiconductor module formed by using the first semiconductor chip 10 and the second semiconductor chip 20. Although FIG. 7 illustrates a circuit diagram of the semiconductor device in the present embodiment, for convenience, in the description of FIG. 6, the Kelvin source electrode 14 of the first semiconductor chip 10 and the Kelvin source electrode 24 of the second semiconductor chip 20 are omitted.

Figure 7:
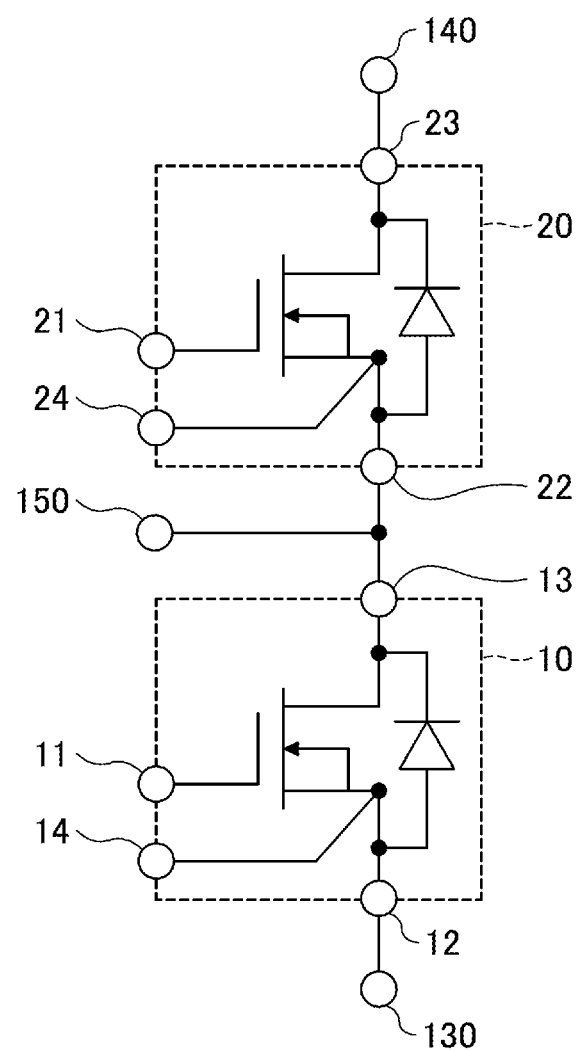
FIG. 7 is a circuit diagram of the semiconductor device according to the first embodiment of the present disclosure.

As illustrated in FIG. 7, in the semiconductor device of the present embodiment, the source electrode 12 of the first semiconductor chip 10 is connected to an N-electrode plate 130, and the drain electrode 23 of the second semiconductor chip 20 is connected to a P-electrode plate 140. Both the drain electrode 13 of the first semiconductor chip 10 and the source electrode 22 of the second semiconductor chip 20 are connected to an O-electrode plate 150. In the present application, the N-electrode plate 130 may be described as a first electrode plate, the P-electrode plate 140 may be described as a second electrode plate, and the O-electrode plate 150 may be described as a third electrode plate.

In the semiconductor device according to the present embodiment, as illustrated in FIG. 6, a first insulating film 131 is formed on part of one surface 130a of the N-electrode plate 130 and a first conductive layer 132 is formed on the first insulating film 131. The O-electrode plate 150 has a first area 151 sandwiched between the N-electrode plate 130 and the P-electrode plate 140 and a second area 152 thicker than the first area 151. The thickness in a third area 153 changes gradually between the first area 151 and the second area 152. Therefore, in the O-electrode plate 150, the first area 151 sandwiched between the N-electrode plate 130 and the P-electrode plate 140 is formed thinner than the second area 152 not sandwiched between the N-electrode plate 130 and the P-electrode plate 140. The O-electrode plate 150 is connected to an external connection terminal (not illustrated) on the second area 152 side. A second insulating film 154 is formed on part of the first area 151, the third area 153, and the second area 152 on one surface 150a of the O-electrode plate 150, and a second conductive layer 155 is formed on the second insulating film 154.

In the third area 153 of the O-electrode plate 150, the thickness gradually increases from the first area 151 side to the second area 152 side, and accordingly, a side surface 130c of the N-electrode plate 130 and a side surface 140c of the P-electrode plate 140 are formed in inclined shapes. It should be noted that the first area 151 of the O-electrode plate 150 is sandwiched between the first semiconductor chip 10 and the second semiconductor chip 20.

Also, the gate electrode 11 on the first surface 10a of the first semiconductor chip 10 and the first conductive layer 132 on the first insulating film 131 formed on the one surface 130a of the N-electrode plate 130 are bonded by a bonding material 181. The source electrode 12 on the first surface 10a of the first semiconductor chip 10 and the one surface 130a of the N-electrode plate 130 are bonded by a bonding material 182. The drain electrode 23 on the second surface 20b of the second semiconductor chip 20 and one surface 140a of the P-electrode plate 140 are bonded by a bonding material 186.

Also, the drain electrode 13 on the second surface 10b of the first semiconductor chip 10 and another surface 150b of the first area 151 of the O-electrode plate 150 are bonded by a bonding material 183. The gate electrode 21 on the first surface 20a of the second semiconductor chip 20 and the second conductive layer 155 on the second insulating film 154 formed on the one surface 150a of the first area 151 of the O-electrode plate 150 are bonded by a bonding material 184. The source electrode 22 on the first surface 20a of the second semiconductor chip 20 and the one surface 150a of the first area 151 of the O-electrode plate 150 are bonded by a bonding material 185.

The N-electrode plate 130 and the P-electrode plate 140 are input terminals and a high voltage is applied to the P-electrode plate 140. The O-electrode plate 150 is an output terminal of driving output of the first semiconductor chip 10 and the second semiconductor chip 20.

In the present embodiment, a heat sink 170 is connected to another surface 130b of the N-electrode plate 130. Because a high voltage is not applied to the N-electrode plate 130, the heat sink 170 can be directly connected to said another surface 130b of the N-electrode plate 130. Accordingly, heat generated by driving the first semiconductor chip 10 and the second semiconductor chip 20 is conducted through the bonding material 182 and the like to the N-electrode plate 130 and further to the heat sink 170. Because an insulator that hinders thermal conduction is not provided between the N-electrode plate 130 and the heat sink 170, heat conducted to the N-electrode plate 130 can be efficiently conducted to the heat sink 170, and the heat can be efficiently dissipated.

It should be noted that in the present embodiment, as illustrated in FIG. 6, a heat sink 171 may be provided via an insulating sheet 160 on another surface 140b of the P-electrode plate 140. In this case, although the insulating sheet 160 hinders the thermal conduction between the P-electrode plate 140 and the heat sink 171, it is preferable to provide a heat sink 171 to contribute to heat dissipation.

In the present embodiment, the first semiconductor chip 10 and the second semiconductor chip 20 are vertical transistors made of SiC. Although the bonding materials 181 to 186 are made of Sn—Cu solder or the like, by using a silver sintered bonding material containing Ag (silver) or a copper sintered bonding material containing Cu having a high thermal conductivity, the thermal resistance can be further reduced.

Also, the heat sinks 170 and 171 are made of Al, Cu, or the like. The first insulating film 131 and the second insulating film 154 are made of an insulating organic material, such as polyimide.

Also, in the present embodiment, it is preferable that the N-electrode plate 130, the P-electrode plate 140, and the O-electrode plate 150 have a thermal conductivity of 10 W/m·K or more, a linear expansion coefficient of 17.0 ppm/K or less, and a volume resistivity of 1 μΩ·m or less. It is more preferable that the thermal conductivity is 150 W/m·K or more. It is more preferable that the linear expansion coefficient is 7.5 ppm/K or less. In order to reduce thermal resistance between the first semiconductor chip 10 or the second semiconductor chip 20 and the heat sink 170 or the heat sink 171, it is preferable that the N-electrode plate 130, the P-electrode plate 140, and the O-electrode plate 150 have a higher thermal conductivity. Also, when the difference between a linear expansion coefficient of the N-electrode plate 130, the P-electrode plate 140, and the O-electrode plate 150 and 4.0 ppm/K that is the thermal expansion coefficient of SiC forming the first semiconductor chip 10 and the second semiconductor chip 20, peeling or the like may occur. Therefore, it is preferable that the linear expansion coefficient of the N-electrode plate 130, the P-electrode plate 140, and the O-electrode plate 150 is a value close to the thermal expansion coefficient of SiC forming the first semiconductor chip 10 and the second semiconductor chip 20 at 4.0 ppm/K. The N-electrode plate 130, the P-electrode plate 140, and the O-electrode plate 150 are connected to the source electrode 12 and the drain electrode 13 of the first semiconductor chip 10 and the source electrode 22 and the drain electrode 23 of the second semiconductor chip 20 to constitute part of wiring. Therefore, it is preferable that the N-electrode plate 130, the P-electrode plate 140, and the O-electrode plate 150 have a low resistance, that is, a low volume resistance. For this reason, in this embodiment, for example, the N-electrode plate 130, the P-electrode plate 140, and the O-electrode plate 150 are made of copper, iron nickel (Fe—Ni) alloy, copper tungsten alloy (Cu—W alloy), molybdenum, a layered material in which copper, iron nickel alloy, and copper are layered in the thick direction, or the like.

The thinner the first area 151 of the O-electrode plate 150, the easier it is to conduct the heat generated in the second semiconductor chip 20 to the heat sink 170 via the first semiconductor chip 10. However, if it is too thin, it is impossible to cause current that is output from the drain electrode 13 of the first semiconductor chip 10 and the source electrode 22 of the second semiconductor chip 20 to sufficiently flow toward the second area 152. Also, if the first area 151 of the O-electrode plate 150 is too thick, the difference in the linear expansion coefficient with the first semiconductor chip 10 and the second semiconductor chip 20 is remarkable. Therefore, it is preferably less than or equal to the thickness of the first semiconductor chip 10 and the second semiconductor chip 20.

Therefore, it is preferable that the thickness of the first area 151 of the O-electrode plate 150 is greater than or equal to 0.1 mm and is less than or equal to the thickness of the first semiconductor chip 10 and the second semiconductor chip 20. Therefore, if the thickness of the first semiconductor chip 10 and the second semiconductor chip 20 is 0.35 mm, it is preferable that the thickness of the first area 151 of the O-electrode plate 150 is greater than or equal to 0.1 mm and less than or equal to 0.35 mm. Also, the second area 152 of the O-electrode plate 150 is formed to be thicker than the first area 151, and for example, the thickness of the second area 152 of the O-electrode plate 150 is about 1.5 mm. Because the second area 152 of the O-electrode plate 150 is thicker than the first area 151, the O-electrode plate 150 can be easily handled and heat can be dissipated through the O-electrode plate 150. Further, it is possible to suppress a voltage drop when current is drawn from the O-electrode plate 150.

In the first semiconductor chip 10, as compared to the voltage applied to the drain electrode 13, the voltage applied to the source electrode 12 has a small difference from the voltage applied to the gate electrode 11, and is a relatively close voltage. Therefore, the film thickness of the first insulating film 131 formed on the one surface 130a of the N-electrode plate 130 can be reduced, and it is preferable that the film thickness of the first insulating film 131 is 10 μm or more and 40 μm or less.

It is preferable that the film thickness of the first conductive layer 132 is greater than or equal to 5 μm and less than or equal to 20 μm. As the thicknesses of the first insulating film 131 and the first conductive layer 132 decrease, the height difference from the one surface 130a of the N-electrode plate 130 decreases, making it easier to bond with the first surface 10a of the first semiconductor chip 10 by the bonding materials 181 and 182. However, if the film thickness of the first insulating film 131 is too thin, the insulating property is decreased, and if the thickness of the first conductive layer 132 is too thin, the electrical conductivity is decreased. Therefore, it is preferable that the film thicknesses of the first insulating film 131 and the first conductive layer 132 are in the ranges as described above.

Here, the area of the gate electrode 11 formed on the first surface 10a of the first semiconductor chip 10 is narrower than the area of the source electrode 12. Because the source electrode 12 is an electrode for flowing current, it is preferable to have a larger area. However, Because the gate electrode 11 is an electrode for control, even if the area is small, there is no problem in terms of characteristics.

Accordingly, heat generated in the first semiconductor chip 10 is conducted to the N-electrode plate 130 via the source electrode 12 and the bonding material 182, and then is efficiently conducted to the heat sink 170, which is connected to said another surface 130b of the N-electrode plate 130, and the heat is dissipated.

Similarly, in the second semiconductor chip 20, as compared to the voltage applied to the drain electrode 23, the voltage applied to the source electrode 22 has a small difference from the voltage applied to the gate electrode 21 and is a relatively close voltage. Therefore, the film thickness of the second insulating film 154 formed on the one surface 150a of the O-electrode plate 150 can be reduced, and it is preferable that the film thickness is 10 μm or more and 40 μm or less.

It is preferable that the film thickness of the second conductive layer 155 is greater than or equal to 5 μm and less than or equal to 20 μm. As the thicknesses of the second insulating film 154 and the second conductive layer 155 decrease, the height difference from the one surface 150a at the first area 151 of the O-electrode plate 150 decreases, making it easier to bond with the first surface 20a of the second semiconductor chip 20 by the bonding materials 184 and 185. However, if the film thickness of the second insulating film 154 is too thin, the insulating property is decreased, and if the film thickness of the second conductive layer 155 is too thin, the electrical conductivity is decreased. Therefore, it is preferable that the thicknesses of the second insulating film 154 and the second conductive layer 155 are in the ranges as described above.

Here, the area of the gate electrode 21 formed on the first surface 20a of the second semiconductor chip 20 is narrower than the area of the source electrode 22. This is because, because the source electrode 22 is an electrode for flowing current, it is preferable to have a larger area, but because the gate electrode 21 is an electrode for control, even if the area is small, there is no problem in terms of characteristics.

Part of the heat generated in the second semiconductor chip 20 is conducted from the first surface 20a of the second semiconductor chip 20 to the source electrode 22, the bonding material 185, the first area 151 of the O-electrode plate 150, the bonding material 183, the first semiconductor chip 10, the bonding material 182, and the N-electrode plate 130 in this order. The heat conducted to the N-electrode plate 130 is conducted to the heat sink 170, which is connected to said another surface 130b of the N-electrode plate 130, and the heat is dissipated by the heat sink 170.

Also, another part of the heat generated in the second semiconductor chip 20 is conducted to the P-electrode plate 140 via the drain electrode 23, which is provided on the second surface 20b of the second semiconductor chip 20, and the bonding material 186. The heat conducted to the P-electrode plate 140 is conducted from another surface 140b of the P-electrode plate 140 to the heat sink 171 via the insulating sheet 160 and is dissipated at the heat sink 171. Because the insulating sheet 160 has a low thermal conductivity and high thermal resistance, the thermal conductivity between the P-electrode plate 140 and the heat sink 171 is not good, and heat dissipation by the heat sink 171 is not so efficient, but the heat sink 171 is preferably provided because it contributes to heat dissipation.

Method of Manufacturing Semiconductor Device

Next, a method of manufacturing a semiconductor device according to the present embodiment will be described with reference to FIG. 8 to FIG. 14.

Figure 8:
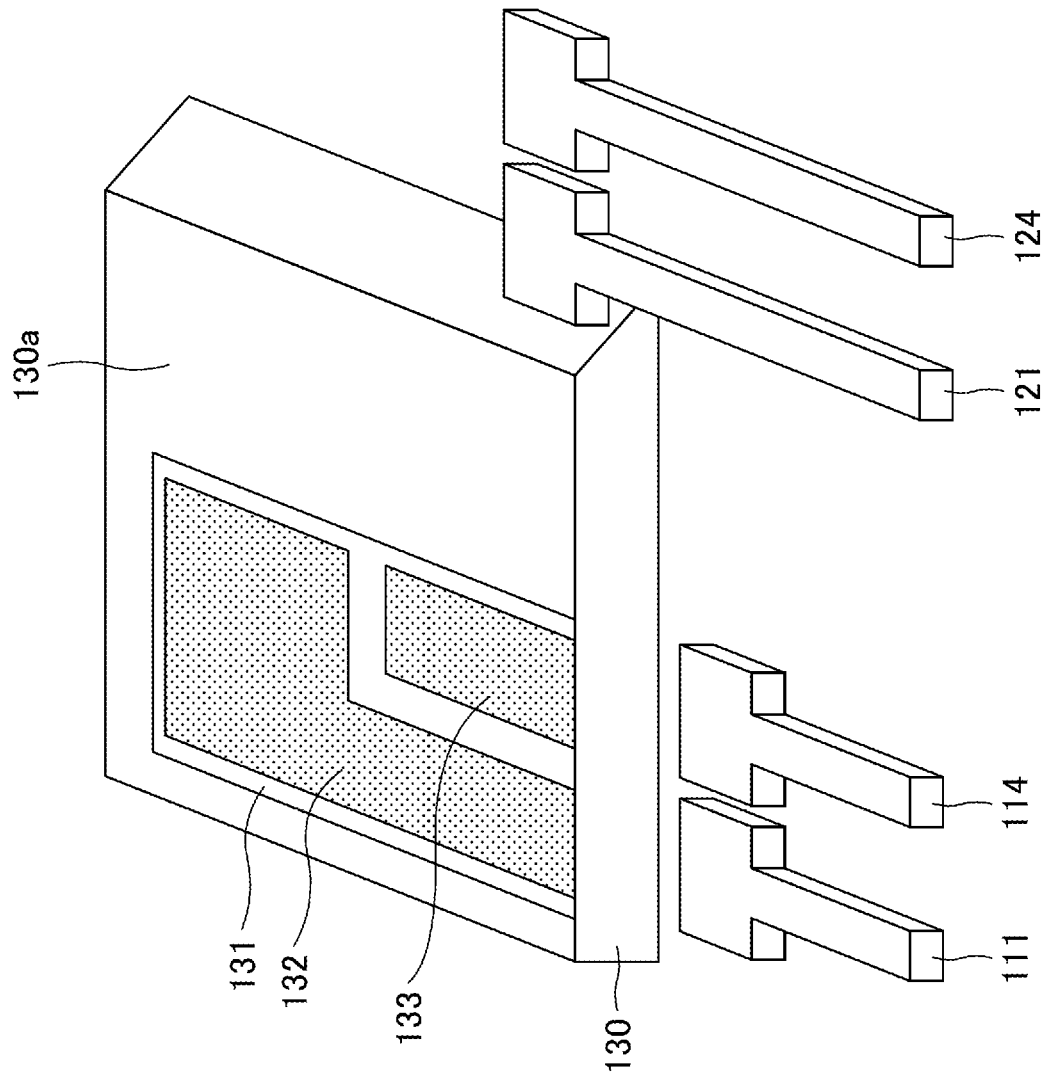
FIG. 8 is an explanatory drawing (1) of a step of manufacturing the semiconductor device according to the first embodiment of the present disclosure.

First, as illustrated in FIG. 8, a lead frame formed with the N-electrode plate 130, the first gate electrode terminal 111, the first Kelvin source electrode terminal 114, the second gate electrode terminal 121, and the second Kelvin source electrode terminal 124 is prepared. The lead frame is formed by a process of punching a metal plate made of Cu or the like. Accordingly, the N-electrode plate 130, the first gate electrode terminal 111, the first Kelvin source electrode terminal 114, the second gate electrode terminal 121, and the second Kelvin source electrode terminal 124 are connected to a case of the lead frame (not illustrated). Because the case of lead frame is cut out at the end of manufacturing steps of the semiconductor device and does not remain in the manufactured semiconductor device, the description of the case of the lead frame will be omitted for convenience in the description of the present embodiment. In the present embodiment, the first insulating film 131 is formed on part of the one surface 130a of the N-electrode plate 130, and the first conductive layers 132 and 133 are formed on the first insulating film 131. The first insulating film 131 is made of a material such as a polyimide having a film thickness of about 10 μm, and the first conductive layers 132 and 133 are made of a Cu film having a film thickness of about 5 μm to 20 μm.

Figure 9:
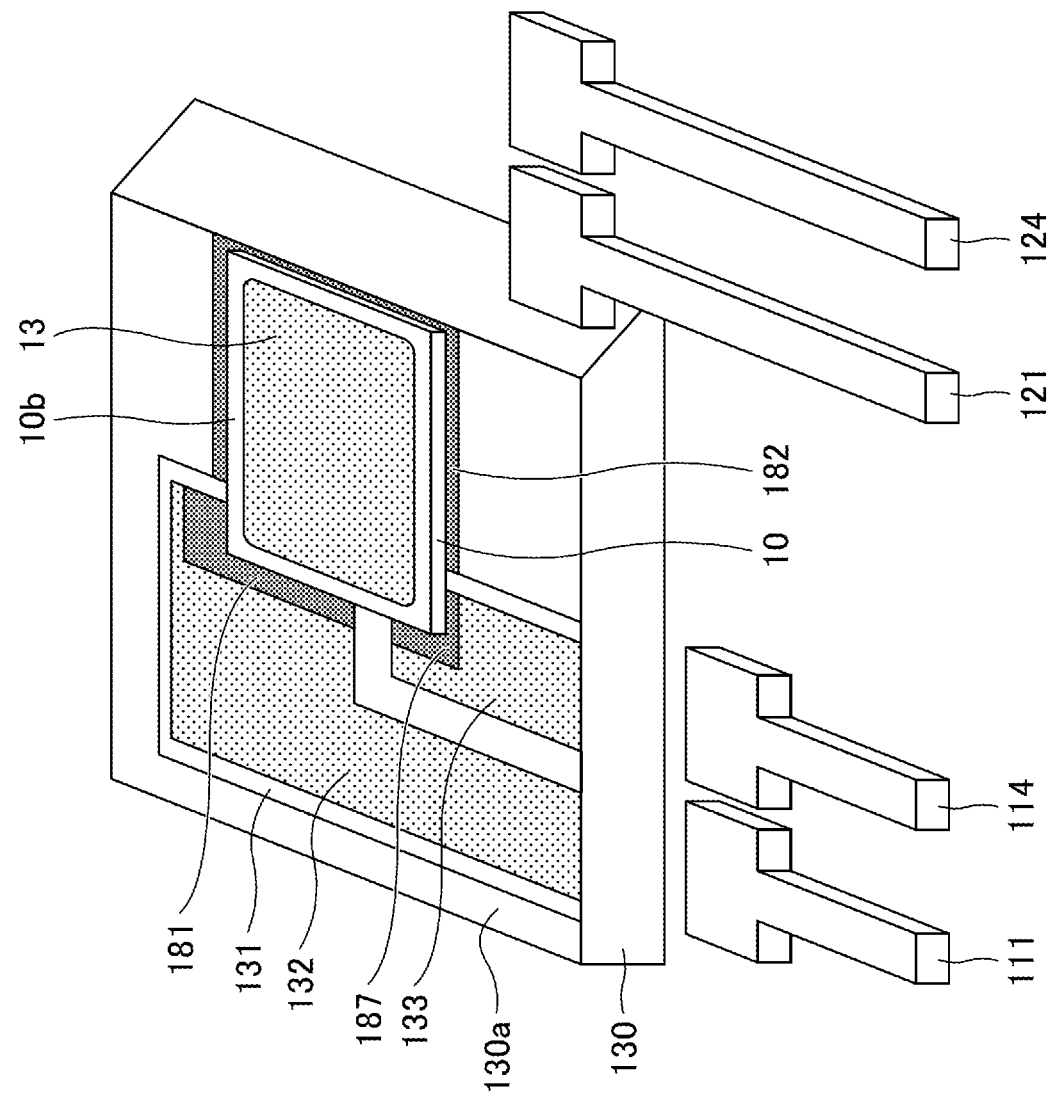
FIG. 9 is an explanatory drawing (2) of a step of manufacturing the semiconductor device according to the first embodiment of the present disclosure.

Next, as illustrated in FIG. 9, the first surface 10a of the first semiconductor chip 10 is bonded to the one surface 130a of the N-electrode plate 130 by the bonding materials 181, 182, and 187. Specifically, as illustrated in FIG. 6, the first conductive layer 132 formed on the one surface 130a of the N-electrode plate 130 and the gate electrode 11 of the first surface 10a of the first semiconductor chip 10 are bonded by the bonding material 181. At the same time, the one surface 130a of the N-electrode plate 130 and the source electrode 12 of the first surface 10a of the first semiconductor chip 10 are bonded by the bonding material 182. Similarly, the first conductive layer 133 and the Kelvin source electrode 14 on the first surface 10a of the first semiconductor chip 10 are bonded by the bonding material 187. At this time, when a solder resist is applied to the area where the first insulating film 131 is exposed, because the solder resist repels the solder which becomes bonding materials, the bonding materials 181, 182, and 187 can be easily separated. In a case in which the first insulating film 131 is a material that repels the solder that becomes bonding materials, such a solder resist may not be applied.

Figure 10:
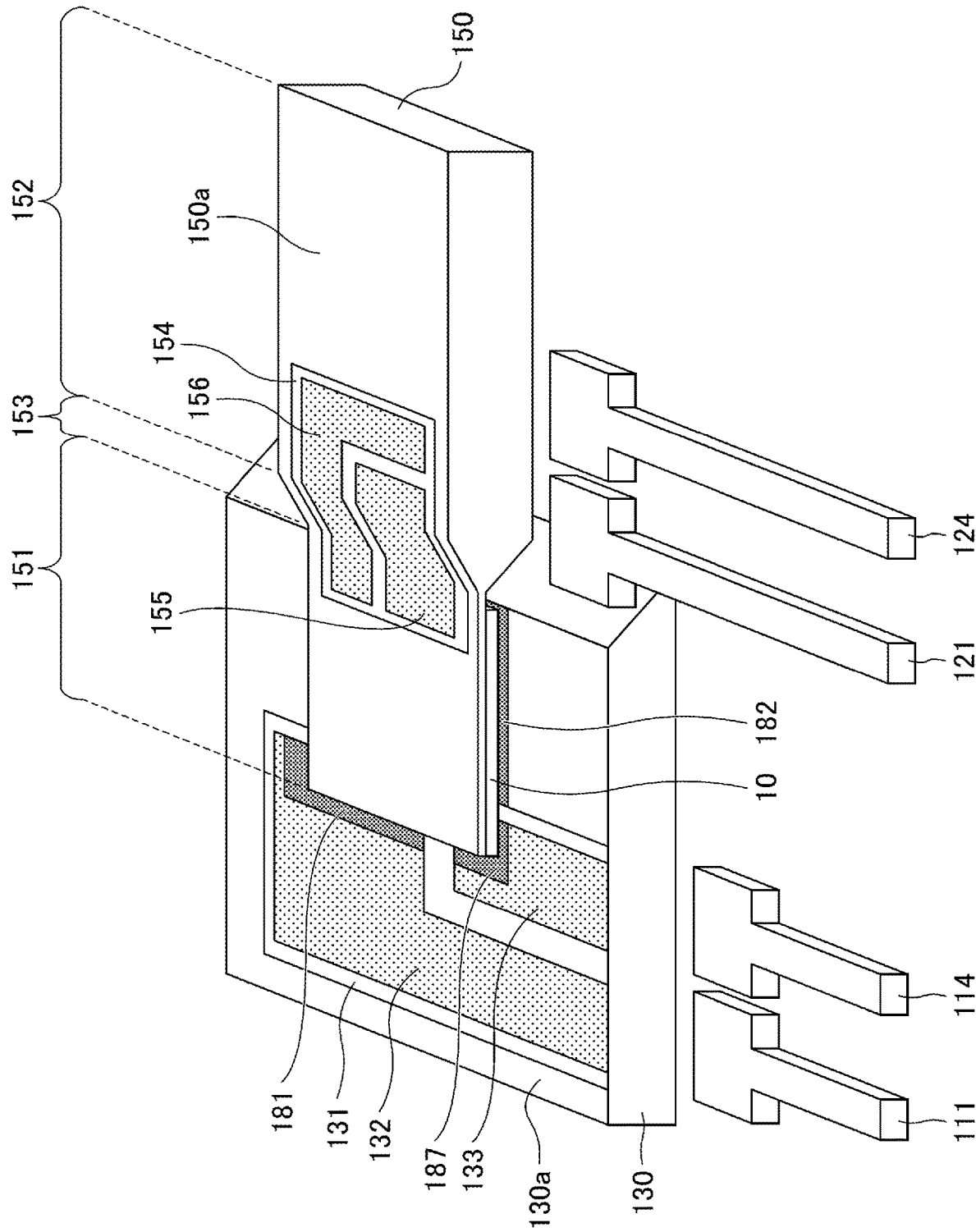
FIG. 10 is an explanatory drawing (3) of a step of manufacturing the semiconductor device according to the first embodiment of the present disclosure.

Next, as illustrated in FIG. 10, another surface 150b of the first area 151 of the O-electrode plate 150 is bonded to the drain electrode 13 on the second surface 10b of the first semiconductor chip 10 by the bonding material 183 illustrated in FIG. 6. On the one surface 150a of the O-electrode plate 150 bonded as described above, the second insulating film 154 is formed on part of the first area 151, the third area 153, and part of the second area 152, and the second conductive layers 155 and 156 are formed on the second insulating film 154.

Figure 11:
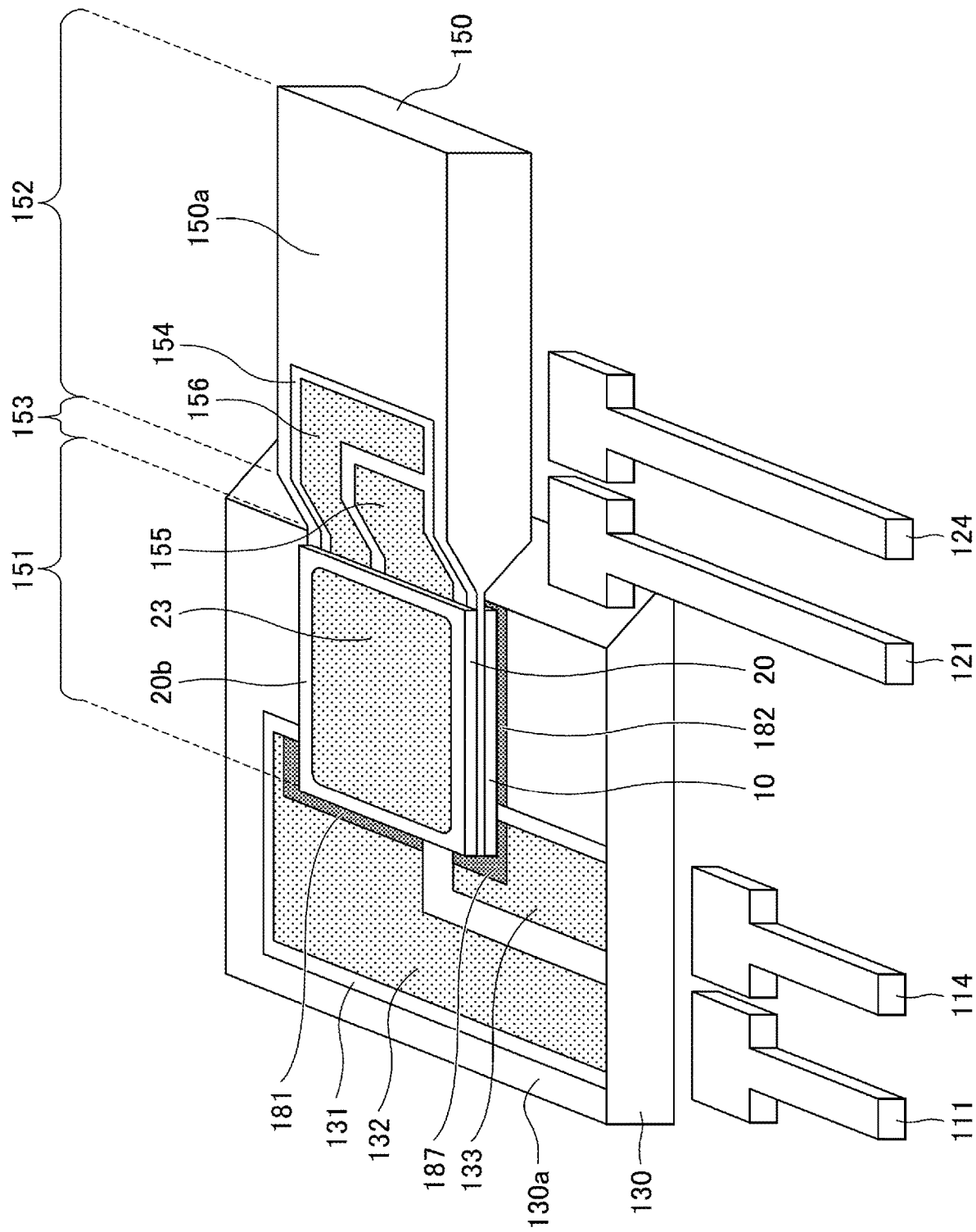
FIG. 11 is an explanatory drawing (4) of a step of manufacturing the semiconductor device according to the first embodiment of the present disclosure.

Next, as illustrated in FIG. 11, the first surface 20a of the second semiconductor chip 20 is bonded to the first area 151 of one surface 150a of the O-electrode plate 150 by bonding materials 184 and 185 and the like illustrated in FIG. 6. Specifically, the second conductive layer 155 on the second insulating film 154 formed on the first area 151 of the one surface 150a of the O-electrode plate 150 and the gate electrode 21 of the first surface 20a of the second semiconductor chip 20 are bonded by the bonding material 184. At the same time, the one surface 150a of the first area 151 of the O-electrode plate 150 and the source electrode 22 on the first surface 20a of the second semiconductor chip 20 are bonded by the bonding material 185. Similarly, the second conductive layer 156 on the second insulating film 154 on the one surface 150a of the O-electrode plate 150 and the Kelvin source electrode 24 on the first surface 20a of the second semiconductor chip 20 are bonded by a bonding material.

Figure 12:
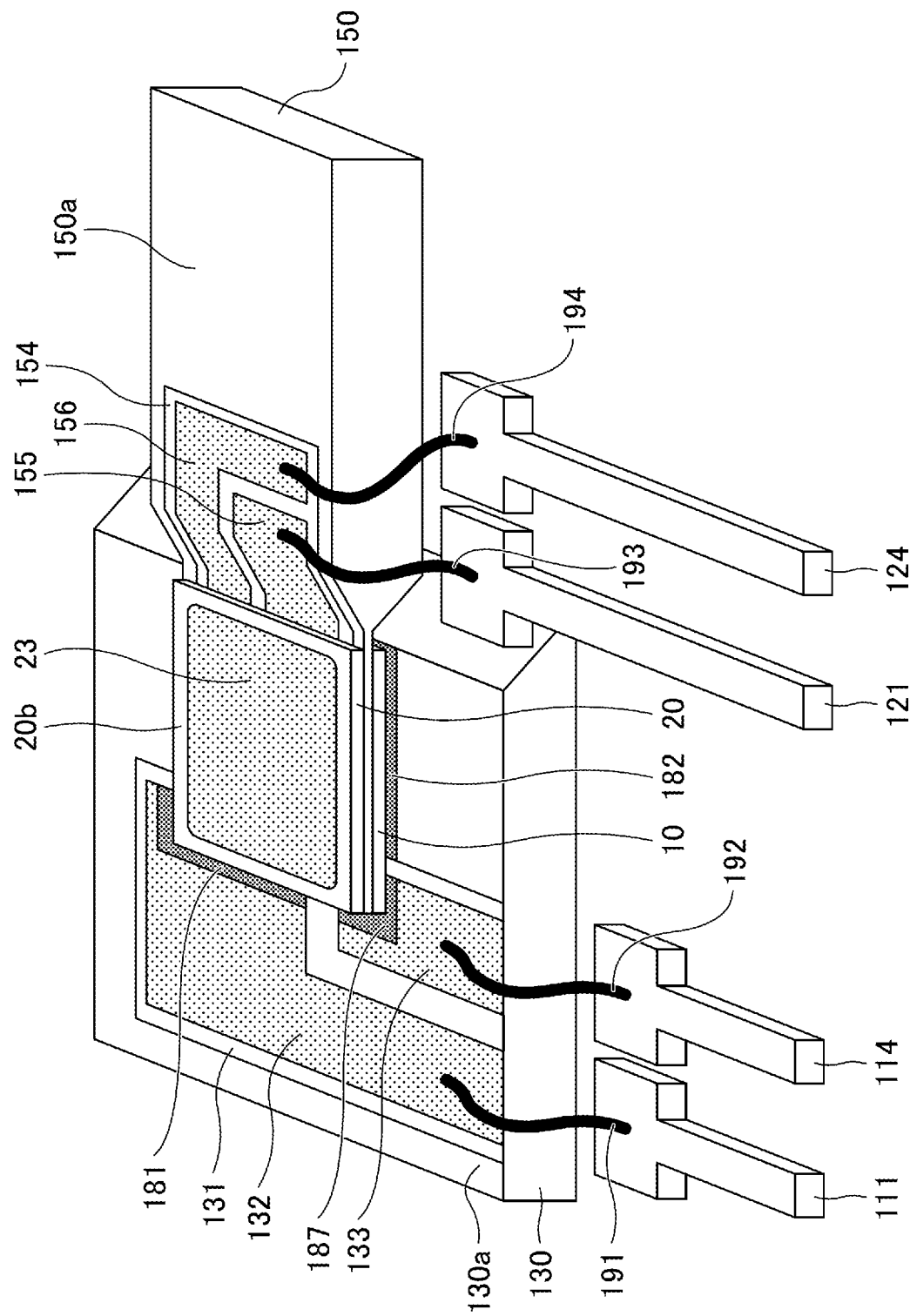
FIG. 12 is an explanatory drawing (5) of a step of manufacturing the semiconductor device according to the first embodiment of the present disclosure.

Next, as illustrated in FIG. 12, the first gate electrode terminal 111, the first Kelvin source electrode terminal 114, the second gate electrode terminal 121, and the second Kelvin source electrode terminal 124 are connected by wire bonding. Specifically, the first conductive layer 132 on the one surface 130a of the N-electrode plate 130 and the first gate electrode terminal 111 are connected by a bonding wire 191. Because the first conductive layer 132 is connected to the gate electrode 11 of the first semiconductor chip 10, the gate electrode 11 of the first semiconductor chip 10 and the first gate electrode terminal 111 are electrically connected by the connection through the bonding wire 191.

Also, the first conductive layer 133 on the one surface 130a of the N-electrode plate 130 and the first Kelvin source electrode terminal 114 are connected by a bonding wire 192. Because the first conductive layer 133 is connected to the Kelvin source electrode 14 of the first semiconductor chip 10, the Kelvin source electrode 14 of the first semiconductor chip 10 and the first Kelvin source electrode terminal 114 are electrically connected by the connection through the bonding wire 192.

Also, the second conductive layer 155 on the one surface 150a of the O-electrode plate 150 and the second gate electrode terminal 121 are connected by a bonding wire 193. Because the second conductive layer 155 is connected to the gate electrode 21 of the second semiconductor chip 20, the gate electrode 21 of the second semiconductor chip and the second gate electrode terminal 121 are electrically connected by the connection through the bonding wire 193.

Also, the second conductive layer 156 on the one surface 150a of the O-electrode plate 150 and the second Kelvin source electrode terminal 124 are connected by a bonding wire 194. Because the second conductive layer 156 is connected to the Kelvin source electrode 24 of the second semiconductor chip 20, the Kelvin source electrode 24 of the second semiconductor chip 20 and the second Kelvin source electrode 124 electrically connected by the connection through the bonding wire 194.

Figure 13:
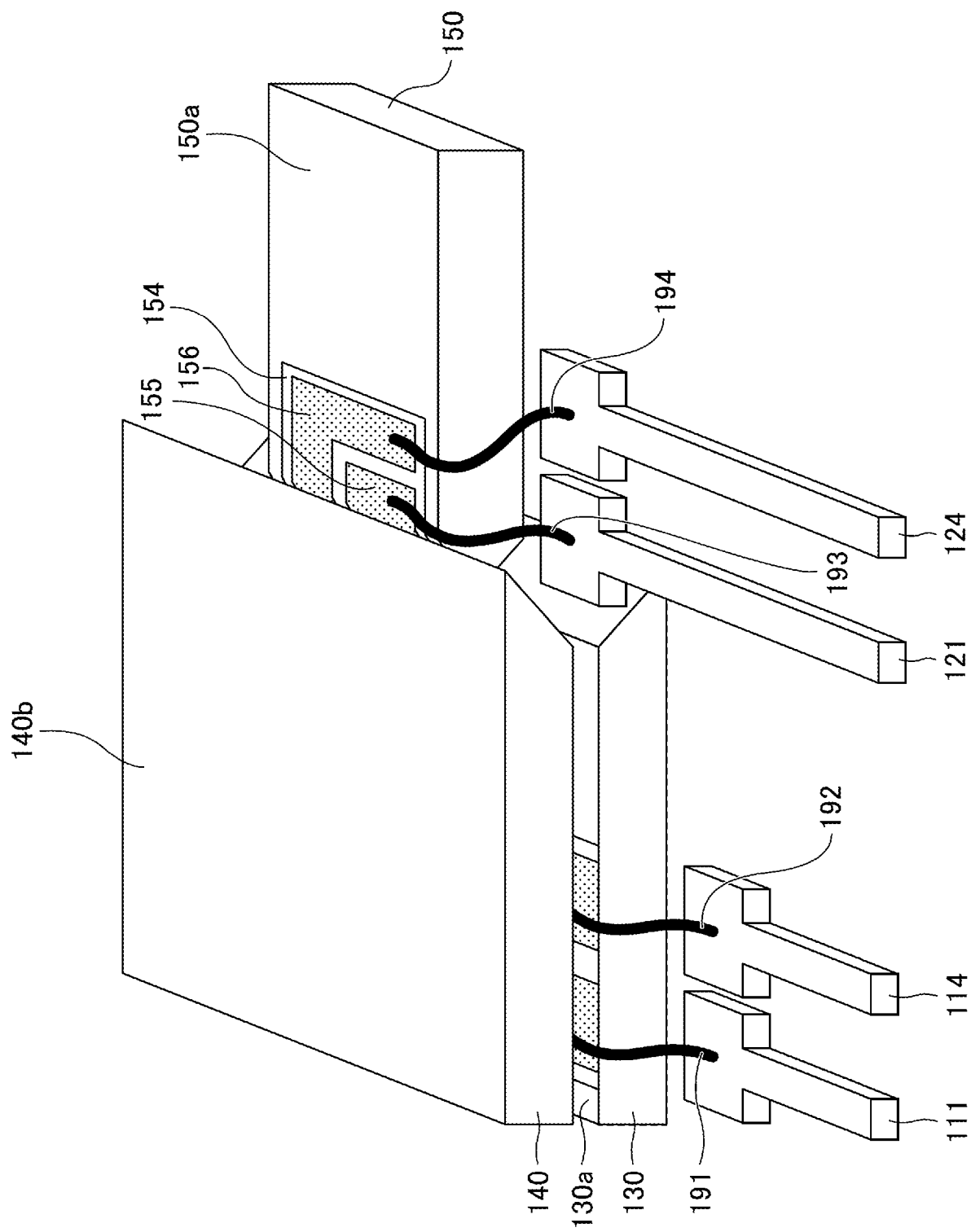
FIG. 13 is an explanatory drawing (6) of a step of manufacturing the semiconductor device according to the first embodiment of the present disclosure.

Next, as illustrated in FIG. 13, the P-electrode plate 140 is bonded to the drain electrode 23 on the second surface 20b of the second semiconductor chip 20 by the bonding material 186 illustrated in FIG. 6.

Figure 14:
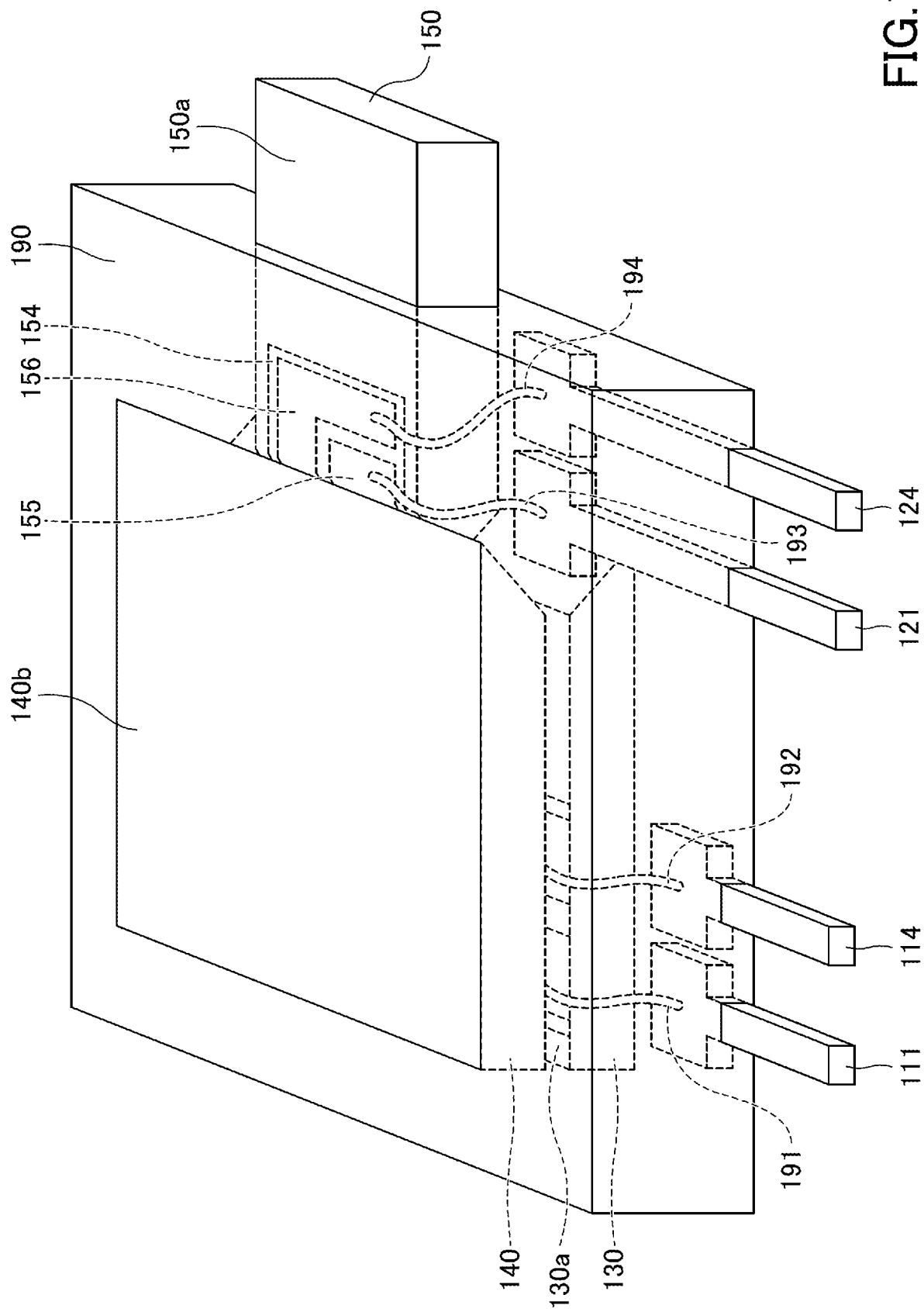
FIG. 14 is an explanatory drawing (7) of a step of manufacturing the semiconductor device according to the first embodiment of the present disclosure.
Figure 15:
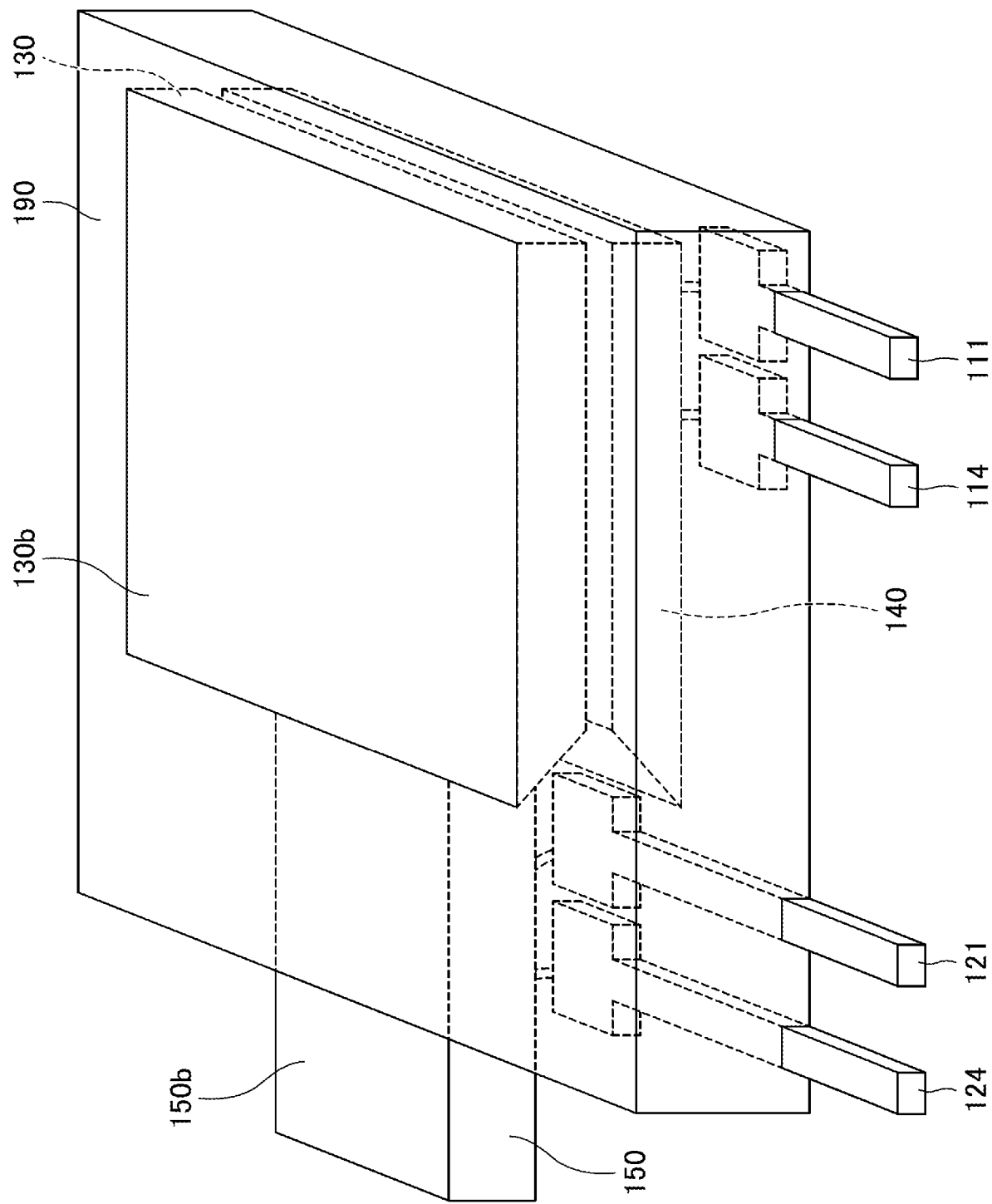
FIG. 15 is an explanatory drawing (8) of a step of manufacturing the semiconductor device according to the first embodiment of the present disclosure.

Next, as illustrated in FIG. 14, the first semiconductor chip 10, the second semiconductor chip 20, the N-electrode plate 130, the P-electrode plate 140, and part of the O-electrode plate 150 are transfer molded and are hardened by a mold resin 190. Thus, the first semiconductor chip 10, the second semiconductor chip 20, the one surface 130a of the N-electrode plate 130, the one surface 140a of the P-electrode plate 140, the first area 151, the third area 153, and part of the second area 152 of the O-electrode plate 150 are covered by the mold resin 190. It should be noted that that said another surface 140b of the P-electrode plate 140 is exposed without being covered by the mold resin 190 and, as illustrated in FIG. 15, said another surface 130b of the N-electrode plate 130 is exposed without being covered by the mold resin 190. FIG. 14 is a perspective view of the P-electrode plate 140 side, and FIG. 15 is a perspective view of the N-electrode plate 130 side.

Figure 16:
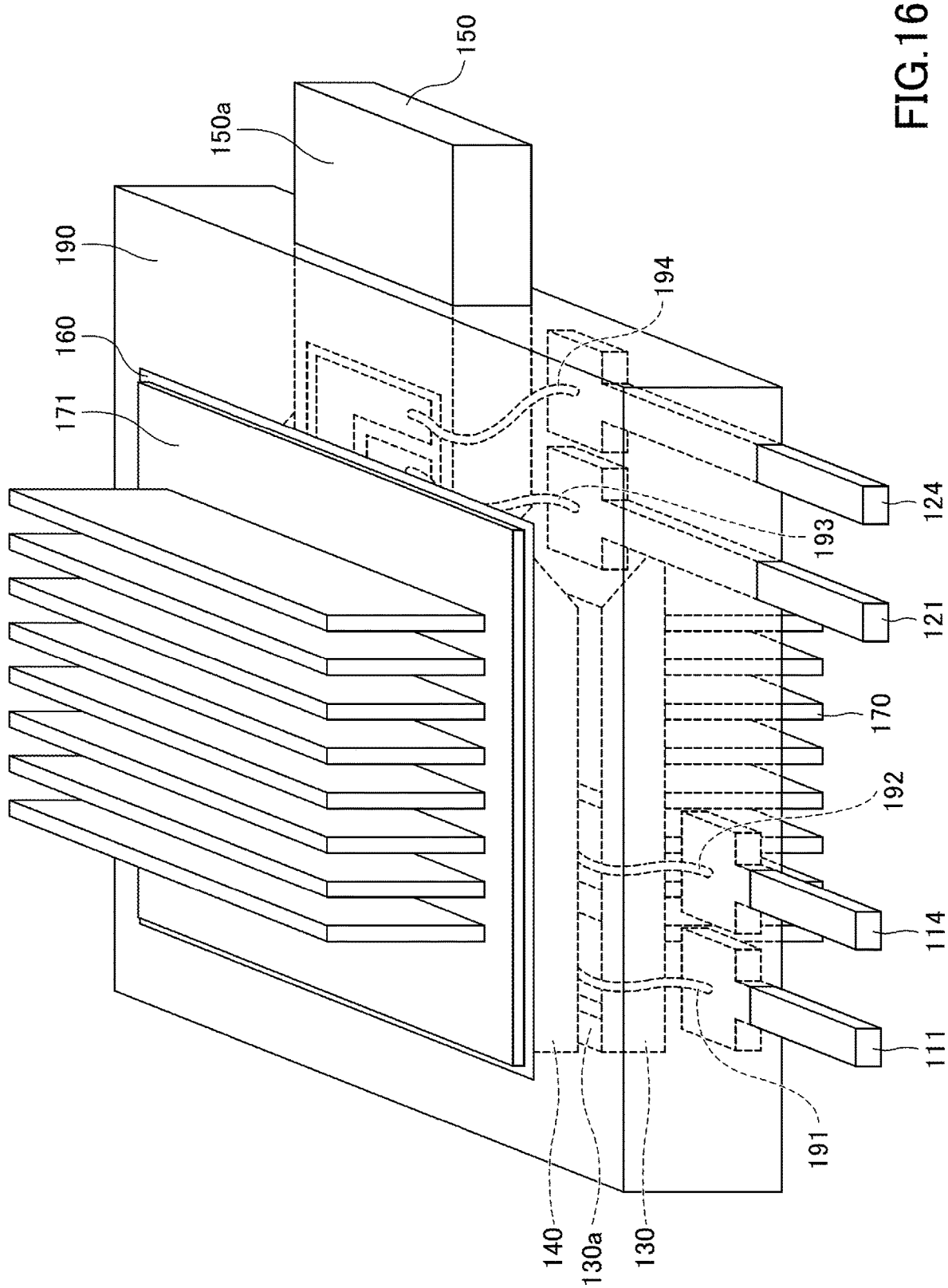
FIG. 16 is an explanatory drawing (9) of a step of manufacturing the semiconductor device according to the first embodiment of the present disclosure.

Next, as illustrated in FIG. 16, a heat sink 170 is directly connected to another surface 130b of the N-electrode plate 130 and a heat sink 171 is connected to another surface 140b of the P-electrode plate 140 via an insulating sheet 160. Although not illustrated, an N-pole input bus bar connected to the N-electrode plate 130 and a P-pole input bus bar connected to the P-electrode plate 140 may be provided.

Through the steps described above, the semiconductor device according to the present embodiment can be manufactured.

Modified Example

Figure 17:
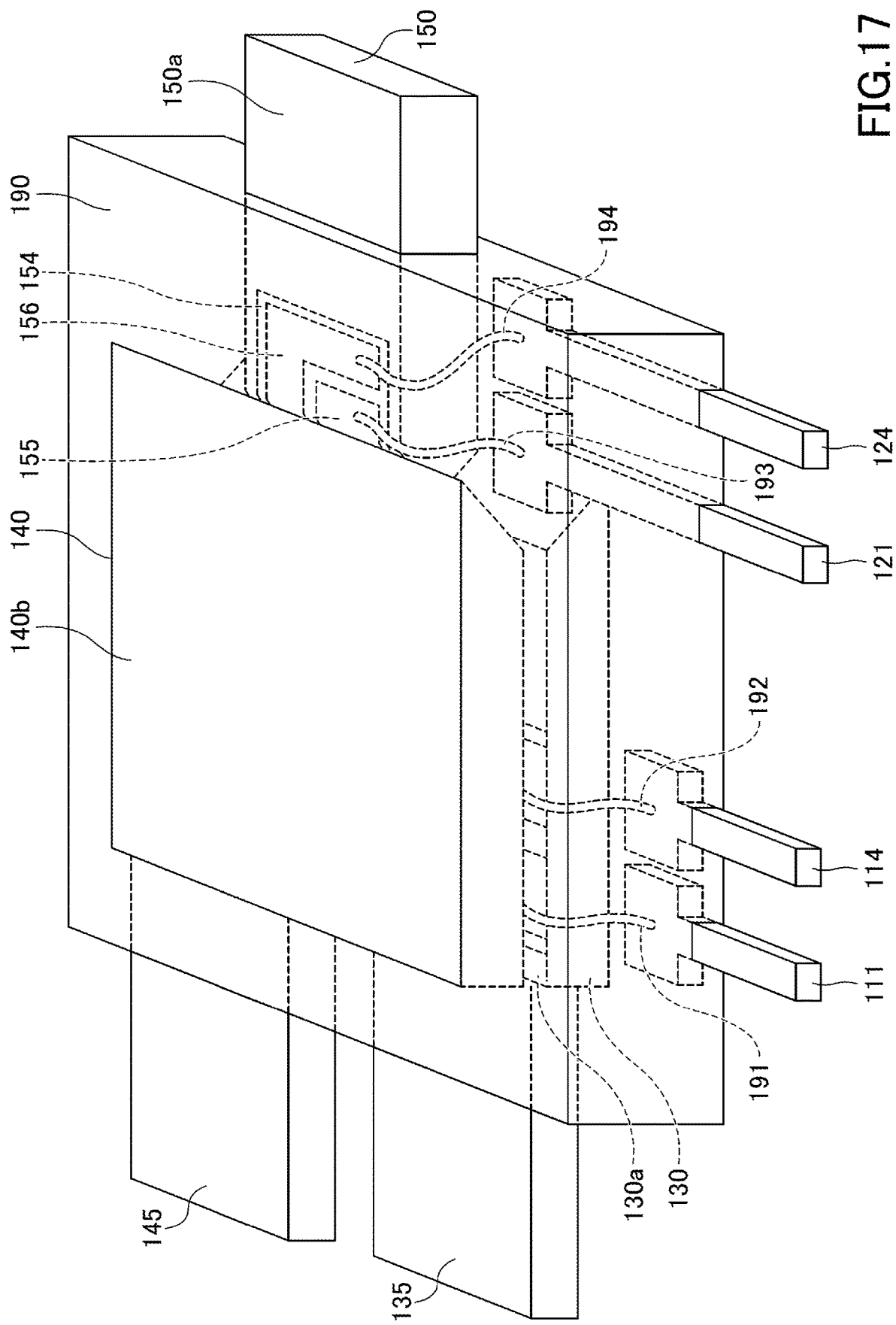
FIG. 17 is an explanatory drawing of a modified example of a semiconductor device according to the first embodiment of the present disclosure.

In a semiconductor device according to the present embodiment, an N-pole input terminal portion 135 may be provided on the N-electrode plate 130 and a P-pole input terminal portion 145 may be provided on the P-electrode plate 140 as illustrated in FIG. 17. The N-pole input terminal portion 135 and the P-pole input terminal portion 145 are outside the mold resin 190. The N-pole input terminal portion 135 may be integrally formed with the N-electrode plate 130 or those formed separately may be connected. Similarly, the P-pole input terminal portion 145 may be integrally formed with the P-electrode plate 140 or those formed separately may be connected.

Second Embodiment

Next, a semiconductor device according to a second embodiment will be described based on a method of manufacturing a semiconductor device according to the present embodiment. The semiconductor device according to the present embodiment is provided with a plurality of first semiconductor chips 10 and second semiconductor chips 20. In the description according to the present embodiment, a case in which two first semiconductor chips 10 and two second semiconductor chips 20 are provided will be described. Therefore, the cross-sectional structure is similar to that in FIG. 6.

Figure 18:
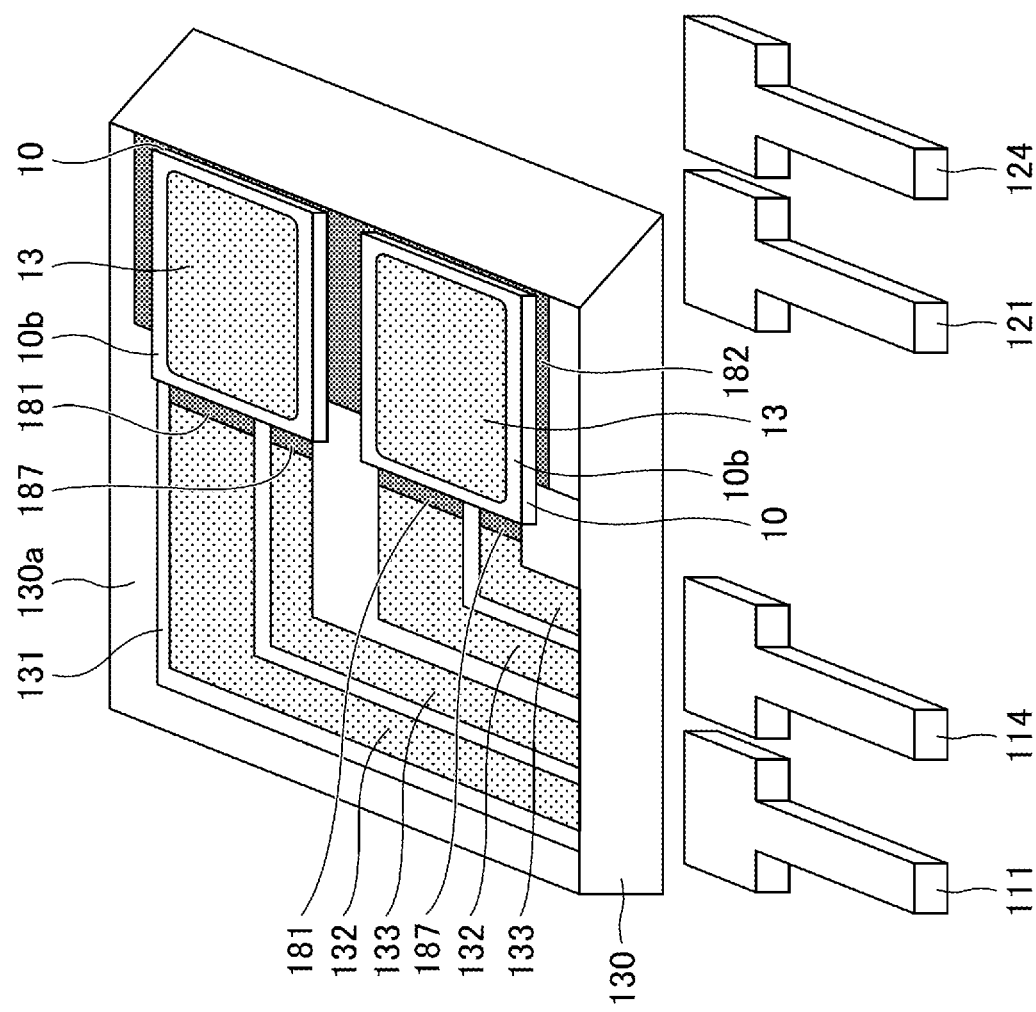
FIG. 18 is an explanatory drawing (1) of a step of manufacturing a semiconductor device according to a second embodiment of the present disclosure.

First, as illustrated in FIG. 18, the respective first surfaces 10a of the first semiconductor chips 10 are bonded to the one surface 130a of the N-electrode plate 130 by the bonding materials 181, 182, and 187. It should be noted that the first insulating film 131 is formed on part of the one surface 130a of the N-electrode plate 130, and the first conductive layers 132 and 133 are formed on the first insulating film 131. Specifically, the first conductive layers 132 formed on the one surface 130a of the N-electrode plate 130 and the gate electrodes 11 of the first surfaces 10a of the respective first semiconductor chips 10 are bonded by the bonding materials 181. At the same time, the one surface 130a of the N-electrode plate 130 and the source electrodes 12 of the first surfaces 10a of the respective first semiconductor chips 10 are bonded by the bonding materials 182. Further, the first conductive layers 133 and the Kelvin source electrodes 14 on the first surfaces 10a of the respective first semiconductor chips 10 are bonded by the bonding materials 187.

Figure 19:
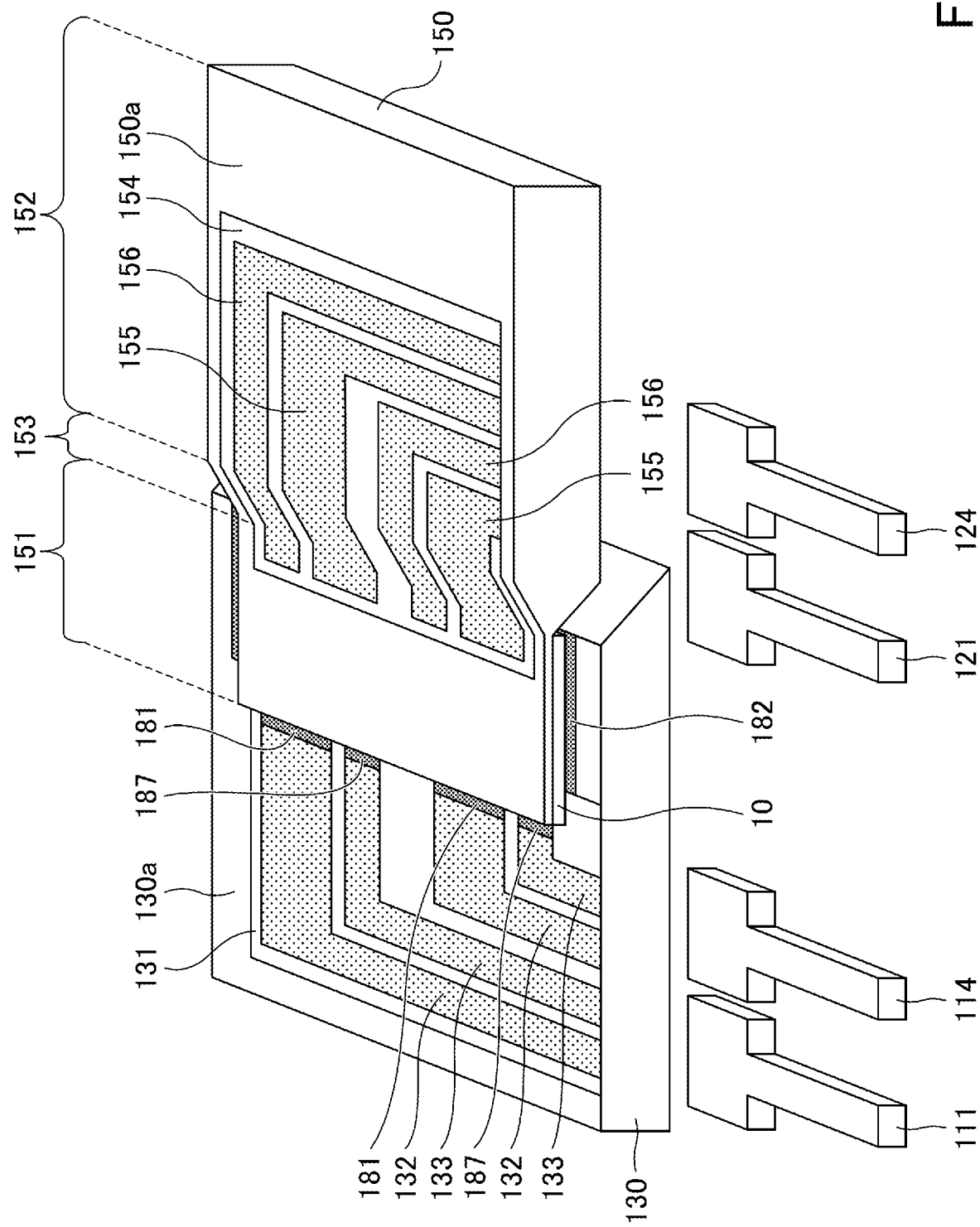
FIG. 19 is an explanatory drawing (2) of a step of manufacturing the semiconductor device according to the second embodiment of the present disclosure.

Next, as illustrated in FIG. 19, another surface 150b of the first area 151 of the O-electrode plate 150 is bonded to the drain electrodes 13 on the second surfaces 10b of the first semiconductor chips 10 by the bonding material 183. On the one surface 150a of the O-electrode plate 150 bonded as described above, the second insulating film 154 is formed on part of the first area 151, the third area 153, and part of the second area 152, the second insulating film 154 is formed. Two second conductive layers 155 and two second conductive layers 156 are formed on the second insulating film 154.

Figure 20:
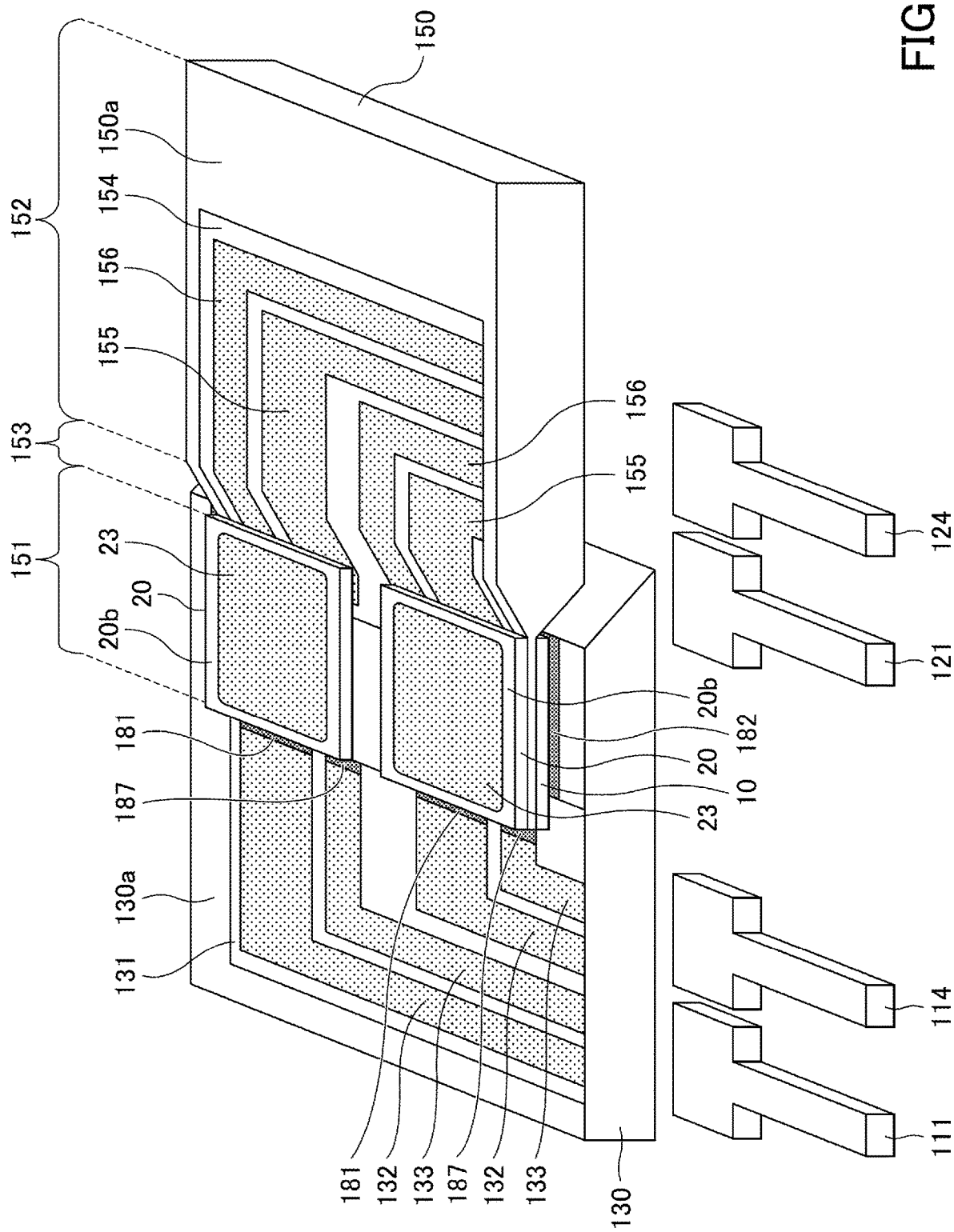
FIG. 20 is an explanatory drawing (3) of a step of manufacturing the semiconductor device according to the second embodiment of the present disclosure.

Next, as illustrated in FIG. 20, the first surfaces 20a of the respective second semiconductor chips 20 are bonded to the first area 151 of the one surface 150a of the O-electrode plate 150 by the bonding materials 184, 185, and the like. Specifically, the second conductive layers 155 on the second insulating film 154 formed in the first area 151 of the one surface 150a of the O-electrode plate 150 and the gate electrodes 21 of the first surfaces 20a of the respective second semiconductor chips 20 are bonded by the bonding materials 184. At the same time, the one surface 150a of the first area 151 of the O-electrode plate 150 and the source electrodes 22 of the first surfaces 20a of the respective second semiconductor chips 20 are bonded by the bonding materials 185. Similarly, the second conductive layers 156 and the Kelvin source electrodes 24 on the first surfaces 20a of the respective second semiconductor chips 20 are bonded by bonding materials.

Figure 21:
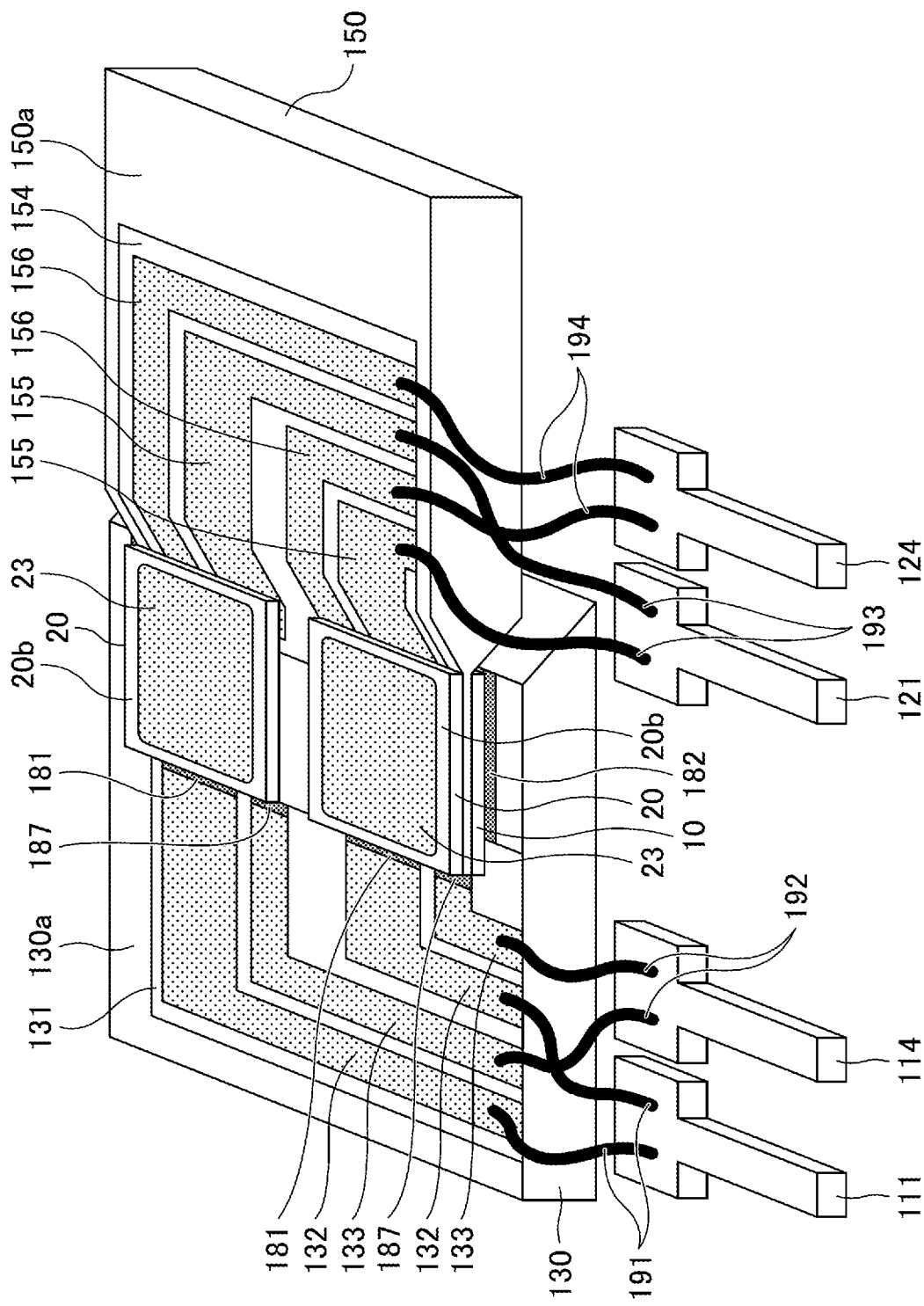
FIG. 21 is an explanatory drawing (4) of a step of manufacturing the semiconductor device according to the second embodiment of the present disclosure.

The first gate electrode terminal 111, the first Kelvin source electrode terminal 114, the second gate electrode terminal 121, and the second Kelvin source electrode terminal 124 are connected by wire bonding, as illustrated in FIG. 21.

Specifically, each of the two first conductive layers 132 on the one surface 130a of the N-electrode plate 130 and the first gate electrode terminal 111 are connected by bonding wires 191. Each of the first conductive layers 133 on the one surface 130a of the N-electrode plate 130 and the first Kelvin source electrode terminal 114 are connected by bonding wires 192. Each of the second conductive layers 155 on the one surface 150a of the O-electrode plate 150 and the second gate electrode terminal 121 are connected by bonding wires 193. Each of the second conductive layer 156 on the one surface 150a of the O-electrode plate 150 and the second Kelvin source electrode terminal 124 are connected by bonding wires 194.

Figure 22:
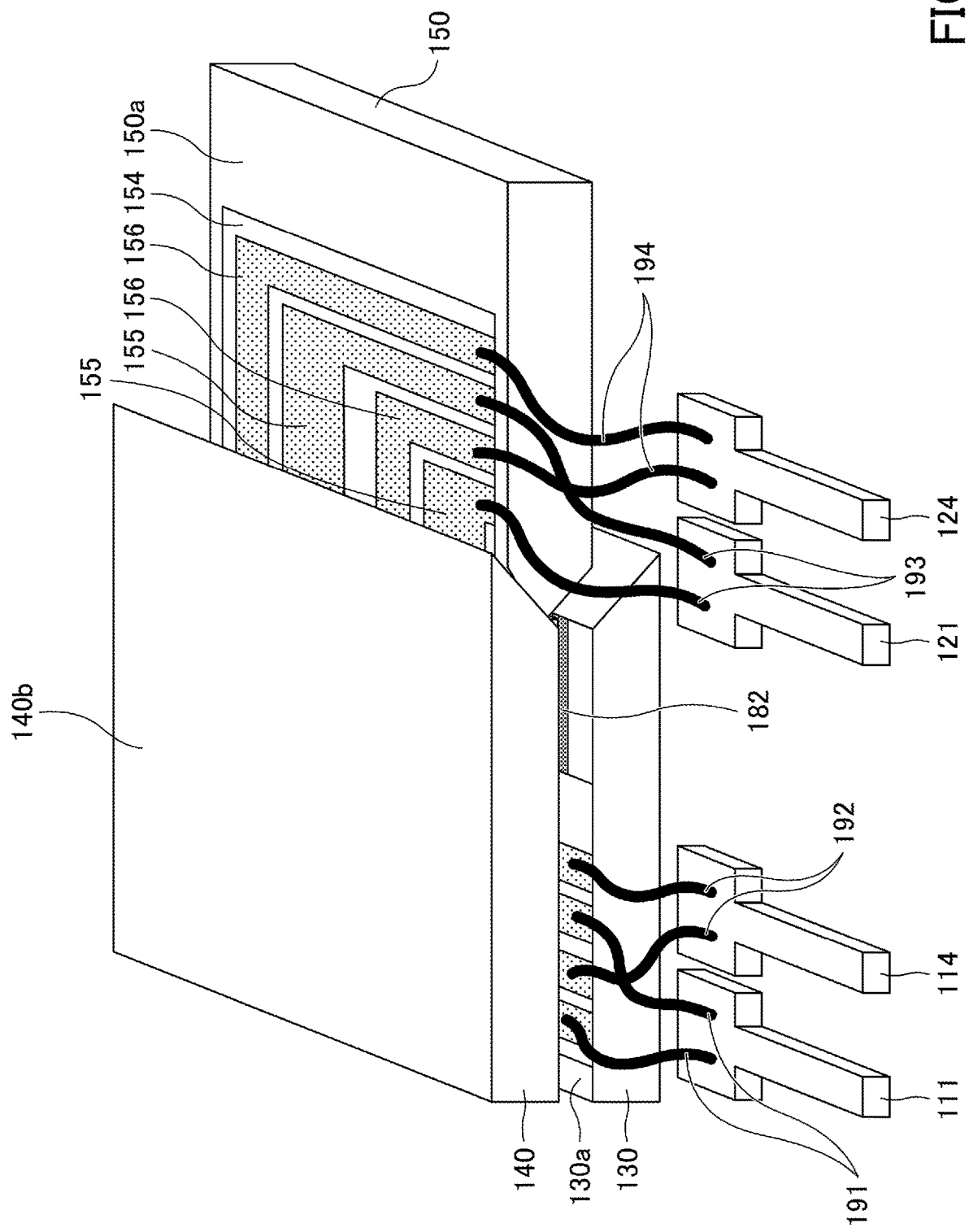
FIG. 22 is an explanatory drawing (5) of a step of manufacturing the semiconductor device according to the second embodiment of the present disclosure.

Next, as illustrated in FIG. 22, the drain electrodes 23 on the second surfaces 20b of the respective second semiconductor chips 20 and the P-electrode plate 140 are bonded by bonding materials.

Figure 23:
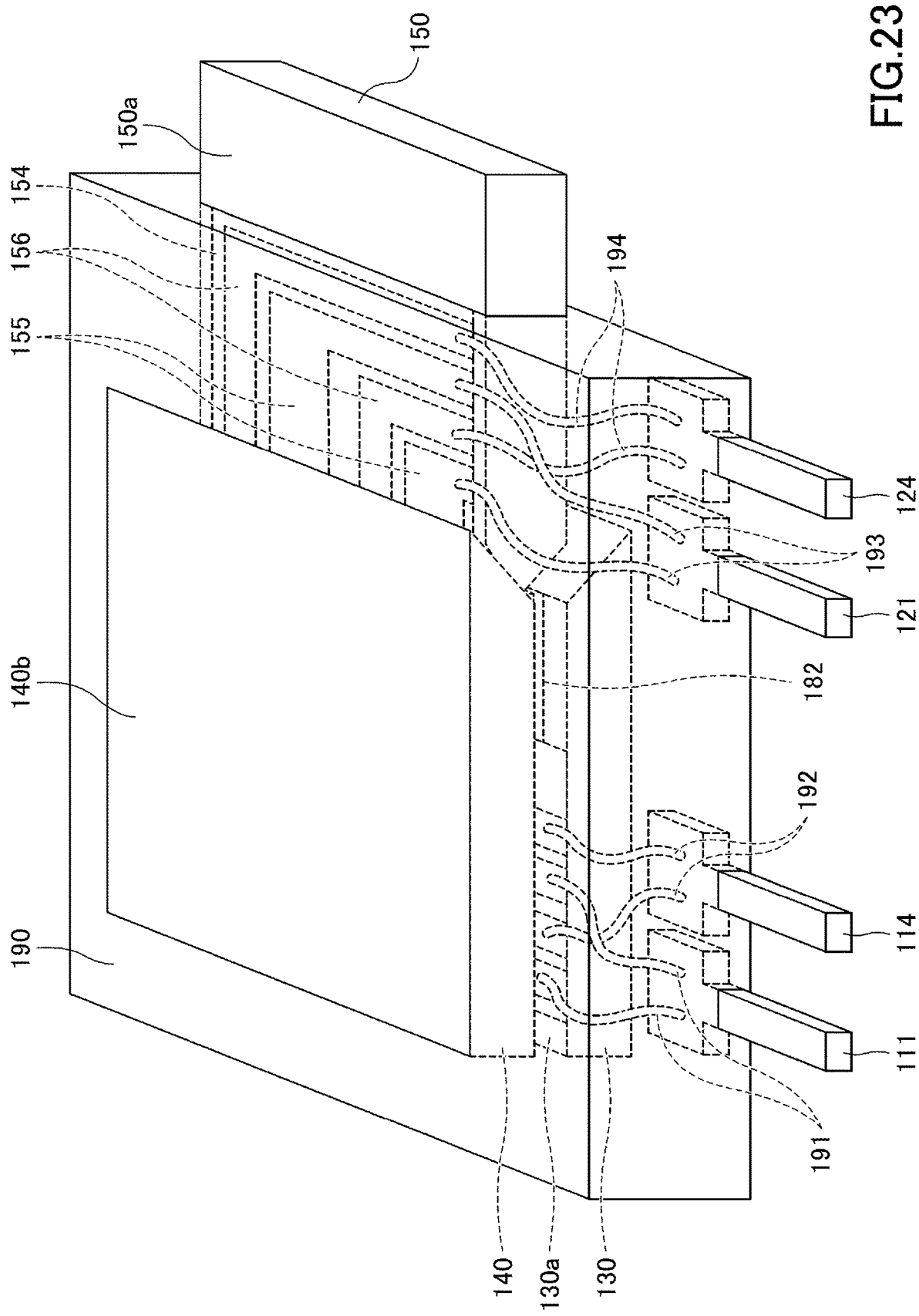
FIG. 23 is an explanatory drawing (6) of a step of manufacturing the semiconductor device according to the second embodiment of the present disclosure.

Next, as illustrated in FIG. 23, the two first semiconductor chips 10, the two second semiconductor chips 20, the N-electrode plate 130, the P-electrode plate 140, and part of the O-electrode plate 150 are transfer molded and hardened by a mold resin 190. Thus, the first semiconductor chips 10, the second semiconductor chips 20, the one surface 130a of the N-electrode plate 130, the one surface 140a of the P-electrode plate 140, the first area 151, the third area 153, and part of the second area 152 of the O-electrode plate 150 are covered by the mold resin 190.

It should be noted that that said another surface 140b of the P-electrode plate 140 is exposed without being covered by the mold resin 190 and said another surface 130b of the N-electrode plate 130 is exposed without being covered by the mold resin 190.

Through the steps described above, the semiconductor device according to the present embodiment can be manufactured.

It should be noted that the contents other than the above are similar to those in the first embodiment.

Although the first semiconductor chip 10 and the second semiconductor chip 20 have been described as MOSFETs in the above description, the first semiconductor chip 10 and the second semiconductor chip 20 may be other types of transistors made of SiC. For example, in the case of an IGBT (Insulated Gate Bipolar Transistor), the first electrode corresponding to the gate electrode 11 is a gate electrode, the second electrode corresponding to the source electrode 12 is an emitter electrode, and the third electrode corresponding to the drain electrode 13 is a collector electrode.

Although the embodiments have been described above in detail, it is not limited to a specific embodiment, and various modifications and changes can be made within the scope recited in claims.

DESCRIPTION OF THE REFERENCE NUMERALS 10 first semiconductor chip
10a first surface
10b second surface
11 gate electrode (first electrode)
12 source electrode (second electrode)
13 drain electrode (third electrode)
14 Kelvin source electrode
20 second semiconductor chip
20a first surface
20b second surface
21 gate electrode (first electrode)
22 source electrode (second electrode)
23 drain electrode (third electrode)
24 Kelvin source electrode
30 N-electrode plate
40 P-electrode plate
50 O-electrode plate
50a one surface
50b another surface
60 insulating sheet
70 heat sink
81, 82, 83, 84 bonding materials
111 first gate electrode terminal
114 first Kelvin source electrode terminal
121 second gate electrode terminal
124 second Kelvin source electrode terminal
130 N-electrode plate
130a one surface
130b another surface
130c side surface
131 first insulating film
132 first conductive layer
133 first conductive layer
135 N-pole input terminal portion
140 P-electrode plate
140a one surface
140b another surface
140c side surface
145 P-pole input terminal portion
150 O-electrode plate
150a one surface
150b another surface
151 first area
152 second area
153 third area
154 second insulating film
155 second conducting layer
156 second conducting layer
160 insulating sheet
170 heat sink
171 heat sink
181 to 187 bonding materials
190 mold resin
191 to 194 bonding wires

The invention claimed is:

1. A semiconductor device comprising:
a first semiconductor chip having a first electrode and a second electrode on a first surface and having a third electrode on a second surface that is opposite to the first surface;
a second semiconductor chip having a fourth electrode and a fifth electrode on a third surface and having a sixth electrode on a fourth surface that is opposite to the third surface;
a first electrode plate bonded to the second electrode of the first semiconductor chip by a first bonding material;
a second electrode plate bonded to the sixth electrode of the second semiconductor chip by a second bonding material; and
a third electrode plate placed between the first semiconductor chip and the second semiconductor chip and having a thickness in a direction perpendicular to longitudinal directions of the first semiconductor chip and the second semiconductor chip, the thickness including a first thickness and a second thickness with the first thickness being thinner than the second thickness,
wherein one surface of the third electrode plate having the first thickness is bonded to the fifth electrode of the second semiconductor chip by a third bonding material, and another surface of the third electrode plate having the first thickness is bonded to the third electrode of the first semiconductor chip by a fourth bonding material,
wherein the third electrode plate having the first thickness overlaps with the first semiconductor chip and the second semiconductor chip as viewed along the direction perpendicular to the longitudinal directions of the first semiconductor chip and the second semiconductor chip, and
wherein the thickness of the third electrode plate includes a third thickness that gradually increases from a first area of the third electrode having the first thickness toward a second area of the third electrode having the second thickness.

2. The semiconductor device according to claim 1, wherein the first thickness of the third electrode plate is greater than or equal to 0.1 mm and is less than or equal to a thickness of the first semiconductor chip and the second semiconductor chip.

3. The semiconductor device according to claim 1, further comprising:
a first insulating film provided on part of one surface of the first electrode plate;
a first conductive layer provided on the first insulating film;
a second insulating film provided on part of one surface of the third electrode plate; and
a second conductive layer provided on the second insulating film,
wherein the first electrode of the first semiconductor chip and the first conductive layer are bonded by a fifth bonding material, and
wherein the fourth electrode of the second semiconductor chip and the second conductive layer are bonded by a sixth bonding material.

4. The semiconductor device according to claim 1, wherein a heat sink is connected to another surface of the first electrode plate.

5. The semiconductor device according to claim 1, wherein the first electrode plate, the second electrode plate, and the third electrode plate have a thermal conductivity of 10 W/m·K or more, a linear expansion coefficient of 17.0 ppm/K or less, and a volume resistivity of 1 µΩ·m or less.

6. The semiconductor device according to claim 1, wherein the first to the fourth bonding materials include copper or silver.

7. The semiconductor device according to claim 1,
wherein the first electrode and the fourth electrode are gate electrodes,
wherein the second electrode and the fifth electrode are source electrodes, and
wherein the third electrode and the sixth electrode are drain electrodes.

8. The semiconductor device according to claim 1,
wherein the first electrode and the fourth electrode are gate electrodes,
wherein the second electrode and the fifth electrode are emitter electrodes, and
wherein the third electrode and the sixth electrode are collector electrodes.

9. The semiconductor device according to claim 1, wherein the first semiconductor chip and the second semiconductor chip include a vertical transistor.

10. The semiconductor device according to claim 1, wherein the first semiconductor chip and the second semiconductor chip are silicon carbide semiconductor chips.

11. A semiconductor device comprising:
a first semiconductor chip having a first electrode and a second electrode on a first surface and having a third electrode on a second surface that is opposite to the first surface;
a second semiconductor chip having a fourth electrode and a fifth electrode on a third surface and having a sixth electrode on a fourth surface that is opposite to the third surface;
a first electrode plate bonded to the second electrode of the first semiconductor chip by a first bonding material;
a second electrode plate bonded to the sixth electrode of the second semiconductor chip by a second bonding material;
a third electrode plate placed between the first semiconductor chip and the second semiconductor chip and having a first area sandwiched between the first semiconductor chip and the second semiconductor chip and a second area not sandwiched between the first semiconductor chip and the second semiconductor chip;
a first insulating film provided on part of one surface of the first electrode plate;
a first conductive layer provided on the first insulating film;
a second insulating film provided on part of one surface of the third electrode plate; and
a second conductive layer provided on the second insulating film,
wherein one surface of the first area of the third electrode plate is bonded to the fifth electrode of the second semiconductor chip by a third bonding material, and another surface of the first area of the third electrode plate is bonded to the third electrode of the first semiconductor chip by a fourth bonding material,
wherein the first electrode of the first semiconductor chip and the first conductive layer are bonded by a fifth bonding material,
wherein the fourth electrode of the second semiconductor chip and the second conductive layer are bonded by a sixth bonding material,
wherein the first to the sixth bonding materials include copper or silver,
wherein a heat sink is connected to another surface of the first electrode plate,
wherein in the third electrode plate, the first area is thinner than the second area, and
wherein a thickness of the third electrode plate gradually increases from the first area toward the second area.

* * * * *